United States Patent
Nakata et al.

(10) Patent No.: US 7,659,357 B2
(45) Date of Patent: Feb. 9, 2010

(54) SILICA FILM FORMING MATERIAL, SILICA FILM AND METHOD OF MANUFACTURING THE SAME, MULTILAYER WIRING STRUCTURE AND METHOD OF MANUFACTURING THE SAME, AND SEMICONDUCTOR DEVICE AND METHOD OF MANUFACTURING THE SAME

(75) Inventors: Yoshihiro Nakata, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 358 days.

(21) Appl. No.: 11/274,094

(22) Filed: Nov. 16, 2005

(65) Prior Publication Data

US 2007/0026689 A1 Feb. 1, 2007

(30) Foreign Application Priority Data

Jul. 8, 2005 (JP) ............................. 2005-200967

(51) Int. Cl.
*C08G 77/00* (2006.01)
*H01L 21/469* (2006.01)
(52) U.S. Cl. ........................ 528/10; 257/499; 438/781
(58) Field of Classification Search ................ 257/499; 438/781; 528/10
See application file for complete search history.

(56) References Cited

U.S. PATENT DOCUMENTS

| 5,853,808 | A | * | 12/1998 | Arkles et al. ................. 427/377 |
| 6,599,846 | B2 | | 7/2003 | Komatsu et al. |
| 6,780,498 | B2 | | 8/2004 | Nakata et al. |
| 2005/0131190 | A1 | * | 6/2005 | Lee et al. ....................... 528/35 |
| 2006/0216531 | A1 | | 9/2006 | Akiyama et al. |

FOREIGN PATENT DOCUMENTS

| JP | 2000-191822 | 7/2000 |
| JP | 2002-284998 | 10/2002 |
| JP | 2004-059738 A | 2/2004 |
| JP | 2004-153147 | 5/2004 |
| JP | 2005-133040 A | 5/2005 |
| WO | WO 01/48806 A1 | 7/2001 |

OTHER PUBLICATIONS

Chinese Office Action dated Dec. 14, 2007 (mailing date), issued in corresponding Chinese Patent Application No. 200510128973.4.

* cited by examiner

*Primary Examiner*—Porfirio Nazario Gonzalez
(74) *Attorney, Agent, or Firm*—Westerman, Hattori, Daniels & Adrian, LLP

(57) ABSTRACT

The silica film forming material of the present invention comprises a silicone polymer which comprises, as part of its structure, CHx, an Si—O—Si bond, an Si—CH$_3$ bond and an Si—CHx- bond, where x represents an integer of 0 to 2.

2 Claims, 5 Drawing Sheets

SILICA FILM FORMING MATERIAL, SILICA FILM AND METHOD OF MANUFACTURING THE SAME, MULTILAYER WIRING STRUCTURE AND METHOD OF MANUFACTURING THE SAME, AND SEMICONDUCTOR DEVICE AND METHOD OF MANUFACTURING THE SAME

CROSS-REFERENCE TO RELATED APPLICATIONS

This application is based upon and claims the benefits of the priority from the prior Japanese Patent Application No. 2005-200967, filed on Jul. 8, 2005, the entire contents of which are incorporated herein by reference.

BACKGROUND OF THE INVENTION

1. Field of the Invention

The present invention relates to a silica film forming material suitable for a multilayer wiring structure in a semiconductor integrated circuit, a silica film formed by using the silica film forming material and a method of manufacturing the same, a multilayer wiring structure and a method of manufacturing the same, and a semiconductor device comprising the silica film as an interlayer insulation film or a protection film and a method of manufacturing the same.

2. Description of the Related Art

With the increase in the level of integration of semiconductor integrated circuits and the improvement of element density in recent years, the demand for higher lamination semiconductor integrated circuits is especially rising. With the trend for higher integrated semiconductor circuits, the space between wirings is becoming narrower, which is creating the problem of a wiring delay due to an increase in inter-wiring capacity. Here, the wiring delay (T) is expressed as the following formula: T∝CR, and is affected by the wiring resistance (R) and the inter-wiring capacity (C). Furthermore, the relationship between the dielectric constant (∈) and the inter-wiring capacity (C) is expressed with the following equation: $C=\epsilon_0 \epsilon_r \cdot S/d$, where S is an electrode area, $\epsilon_0$ is a electric constant, $\epsilon_r$ is a dielectric constant of the insulation film, and d is a space between the wirings, respectively. The inter-wiring capacity (C) may be decreased by making the wiring thickness to be thinner to reduce the electrode area, but making the wiring thickness thinner causes a further rise in the wiring resistance (T), which in turn prevents the achievement of higher speed. Hence, lowering the dielectric constant of the insulation film becomes an effective method for minimizing the wiring delay (T) and achieving higher speed.

With an increase in the level of the integration of the semiconductor integrated circuit and the improvement in element density in recent years, a space between metal wirings tends to become narrow in a semiconductor device having a multilayer wiring structure. Hence, the impedance of the metal wiring due to static electricity induction is rising, leading to concern that the response speed may be delayed and electric consumption is growing. For this reason, it becomes crucial to make the relative dielectric constant of the interlayer insulation film provided between the semiconductor substrate and the metal wiring layer or between the metal wiring layers to be as small as possible.

Example of conventional material of the insulation film is an inorganic material such as a silicon dioxide ($SiO_2$), a silicon nitride (SiN), and a phospho-silicate glass (PSG), or an organic polymer material such as a polyimide. However, the dielectric constant of $CVD$-$SiO_2$ film frequently used in semiconductor device is high at around 4. Moreover, SiOF film, which is considered to be used as low dielectric constant CVD film, has a dielectric constant of about 3.3 to 3.5, but it has the problem of high moisture absorption properties that result in a rising dielectric constant over time. Moreover, porous silica film having low dielectric constant has been proposed (See Japanese Patent Application Laid-Open (JP-A) No. 2004-153147). The method of manufacturing such a porous film enables further lowering of the dielectric constant because the method contains a process in which the heat-degradable components are heated and degraded to form pores.

However, in the case of porous film of the siloxane resin, etching processing is difficult due to the properties of such a porous film, hence formation of plasma CVD film such as SiCH with a dielectric constant of about 4.5 in order to protect the film is required. This presents a problem in which the low dielectric constant properties of the porous film cannot be utilized effectively. Moreover, in forming fine wirings of 0.1 μm or less, an insulation film hard mask, a three-layered resist or the like is applied, which presents a problem in which the short of wirings or the leak current through the insulation film is created due to the impossibility of a high-degree of etching selectivity relative to the porous film or protective film in a dry etching.

An objective of the present invention is to overcome the aforementioned problems of the related art, and to achieve the following object. In fact, an object of the present invention is to provide: a silica film which excels in properties of etching resistance, chemical resistance, and moisture resistance with superior adhesive properties and has a low dielectric constant; a method of effectively forming the silica film; a silica film forming material suitable for forming the silica film; a multilayer wiring structure enabling lowering of the parasitic inter-wiring capacity; a method of effectively forming the multilayer wiring structure; a semiconductor device with high reliability and high speed having the silica film as an interlayer insulation film or protection film; and a method of effectively manufacturing the semiconductor device.

SUMMARY OF THE INVENTION

The silica film forming material according to the present invention comprises a silicone polymer which comprises, as part of its structure, CHx, an Si—O—Si bond, an Si—CH$_3$ bond and an Si—CHx- bond, where x represents an integer of 0 to 2.

Preferably, the silicone polymer is obtained by a hydrolysis condensation polymerization reaction of at least one of silicon compounds expressed by the following general formulas (1) to (3), and at least one of silicon compounds expressed by the following general formulas (4) to (7):

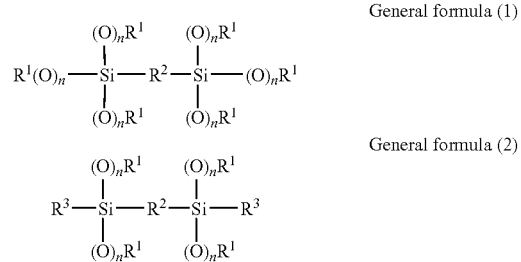

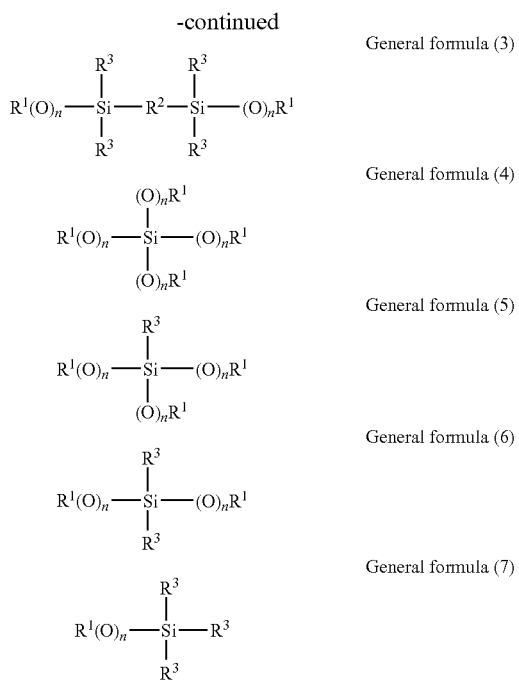

General formula (3)
General formula (4)
General formula (5)
General formula (6)
General formula (7)

where, in the general formulas (1) to (7), n represents either 0 or 1; $R^1$ may be the same as or different from each other, represents one selected from the group consisting of a chlorine atom, a bromine atom, a fluorine atom, and a hydrogen atom when n=0, and represents one selected from the group consisting of a hydrocarbon with a carbon number of 1 to 4, an aromatic hydrocarbon, a hydrogen atom and a carboxyl group when n=1; $R^2$ represents one selected from the group consisting of a hydrocarbon with a carbon number of 1 to 4, an aromatic hydrocarbon, and a hydrogen atom; and $R^3$ may be the same as or different from each other, and represents one selected from the group consisting of a hydrocarbon with a carbon number of 1 to 3 and an aromatic hydrocarbon.

In the silica film forming material, the silicone compounds expressed by the general formulas (1) to (3) each have excellent properties of etching resistance, chemical resistance and moisture resistance, and the silicone compounds expressed by the general formulas (4) to (7) each have excellent adhesion properties. Hence, silicone polymer obtained by the hydrolysis condensation polymerization reaction of these silicon compounds excels in all properties of the etching resistance, chemical resistance, moisture resistance, and adhesion property, making the silicone polymer suitable for use in the formation of a silica film and multilayer wiring structure, which is ideal for various semiconductor devices. Moreover, the silicon polymer is especially suitable for use in the formation of the silica covering film of the present invention, multilayer wiring structure of the present invention and the semiconductor device of the present invention.

The method of manufacturing a silica film according to the present invention comprises: coating a silica film forming material on a surface to be processed; and heating the surface to be processed, wherein the silica film forming material comprises a silicone polymer which comprises, as part of its structure, CHx, an Si—O—Si bond, an Si—CH$_3$ bond and an Si—CHx- bond, where x represents an integer of 0 to 2. In the method of manufacturing a silica film, the silica film forming material is coated onto the surface to be processed, and then heated. The result of which is the effective formation of the silica covering film. The method of manufacturing a silica film is especially suitable for the formation of the silica film of the present invention.

The silica film according to the present invention is formed by coating a silica film forming material on a surface to be processed; and heating the surface to be processed, wherein the silica film forming material comprises a silicone polymer which comprise, as part of its structure, CHx, an Si—O—Si bond, an Si—CH$_3$ bond and an Si—CHx- bond, where x represents an integer of 0 to 2. Because it is formed with the silica film forming material of the present invention, it has excellent properties of etching resistance, chemical resistance and moisture resistance. Moreover, it has excellent adhesive properties with an underlying layer. For this reason, it may be used as a hard mask during a dry etching, simplifying the formation of a fine pattern. Further, because the adhesive properties are excellent even when the underlying layer has a small contact area, such as with porous film, separation from the underlying layer is prevented. Still further, because of a low dielectric constant, the parasitic capacity is reduced, and the signal transmission speed is improved, making it especially suitable for use in a high integration semiconductor integration circuit such as an IC and LSI in which higher response speeds are required.

The drop of the signal transmission speed due to the parasitic capacity of the insulation film has been known, but the effect of wiring delays on an overall device was small for generation in which the space between wirings of the semiconductor device is 1 μm or more. With the higher integration and introduction of the multilayer wiring structure in recent years, the wiring width and the space between the wirings are becoming narrower, creating the problem of raising the wiring resistance and increasing parasitic inter-wiring capacity, particularly when the space of wirings is less than 1 μm. Because the signal transmission speed is determined in the multilayer wiring structure of the semiconductor integration circuit by the wiring resistance and the parasitic inter-wiring capacity, which are major factors that control performance of the devices, such as the semiconductor integration circuit, the rise of wiring resistance and the increase in parasitic inter-wiring capacity are major problems to be overcome and are causes for a drop in the signal transmission speed. In order to improve the signal transmission speed, lowering the wiring resistance and decreasing the parasitic inter-wiring capacity (dielectric constant of insulation film) are essential. The parasitic inter-wiring capacity may be reduced by making the wiring thinner to make the cross sectional-area smaller, but making the wiring thinner causes a rise in the wiring resistance. In other words, lowering the parasitic inter-wiring capacity and decreasing the wiring resistance are in an antinomic relationship, making it difficult to improve the signal transmission speed. However, the silica film according to the present invention that may contribute to improving the response speed with a low dielectric constant enables lowering the parasitic inter-wiring capacity and a decrease in the wiring resistance, making it possible to improve the signal transmission speed.

The multilayer wiring structure according to the present invention comprises a silica film, wherein the silica film is formed by: coating a silica film forming material on a surface to be processed; and heating the surface to be processed, and wherein the silica film forming material comprises a silicone polymer which comprises, as part of its structure, CHx, an Si—O—Si bond, an Si—CH$_3$ bond and an Si—CHx- bond, where x represents an integer of 0 to 2. Because the silica film of the present invention with reduced parasitic capacity and a lower dielectric constant is contained in the multilayer wiring structure, it is possible to improve the signal transmission speed. Hence it is especially suitable for use in a semiconductor integration circuit in which higher response speeds are required.

The method of manufacturing a multilayer wiring structure according to the present invention comprises: forming the silica film by coating a silica film forming material on a surface to be processed and by heating the surface to be processed; and forming a wiring, wherein the silica film forming material comprises a silicone polymer which comprises, as part of its structure, CHx, an Si—O—Si bond, an Si—CH$_3$ bond and an Si—CHx- bond, where x represents an integer of 0 to 2. In the method of manufacturing a multilayer wiring structure, the silica film is formed by coating the silica film forming material and by heating the surface to be processed so as to form the silica film, and then, the wiring is formed. With repeated execution of the series of processes of forming a silica film and forming a wiring, the multilayer wiring structure of the present invention is efficiently formed. The method of manufacturing a multilayer wiring structure is especially suitable for the formation of the multilayer wiring structure of the present invention.

The semiconductor device according to the present invention comprises a silica film, the silica film being used as one of an interlayer insulation film and a protection film formed on a surface of the interlayer insulation film, wherein the silica film formed by: coating a silica film forming material on a surface to be processed; and heating the surface to be processed, and wherein the silica film forming material comprises a silicone polymer which comprises, as part of its structure, CHx, an Si—O—Si bond, an Si—CH$_3$ bond and an Si—CHx- bond, where x represents an integer of 0 to 2. Because the semiconductor device comprises the silica film of the present invention, both lowering of the parasitic interwring capacity and decreasing the wiring resistance are achieved, making it especially suitable for high speed and highly reliable flash memories, such as DRAM, FRAM, MOS transistors and the like.

The method of manufacturing s semiconductor device according to the present invention comprises: forming a silica film on a surface to be processed, using a silica film forming material; and patterning the surface to be processed by performing an etching, using the silica film as a mask, wherein the silica film forming material comprises a silicone polymer which comprises, as part of its structure, CHx, an Si—O—Si bond, an Si—CH$_3$ bond and an Si—CHx- bond, where x represents an integer of 0 to 2. In the method of manufacturing a semiconductor device, first, the silica film is formed using the silica film forming material on the surface to be processed, which is a target on which the multilayer wiring structure is formed. Next, the surface to be processed is patterned through an etching with the formed silica film as a mask. As a result, both lowering of the parasitic inter-wiring capacity and decreasing the wiring resistance are achieved, and a high performance semiconductor with a higher signal transmission speed is efficiently manufactured. The method of manufacturing a semiconductor device is especially suitable for the method of manufacturing the semiconductor device of the present invention.

Conventionally, the semiconductor device has been manufactured by forming a low dielectric constant insulation film (interlayer insulation film), forming a protective layer through a plasma CVD, and forming an etching stopper layer. However, such a manufacturing method requires the formation of an interlayer insulation film through reciprocation of a vacuum chamber and a curing furnace, creating the problem of high cost. However, in the method of manufacturing a semiconductor device of the present invention, the silica film of the present invention is formed, making it possible to lower insulation film lamination cost and decrease parasitic capacity through a lower dielectric constant, the result of which is the achievement of an improvement in signal transmission speed. Moreover, because of excellent etching resistance, the silica film may be used as a hard mask during a dry etching, enabling more efficient manufacture of a semiconductor device with effective fine pattern formation.

Figure 1A:
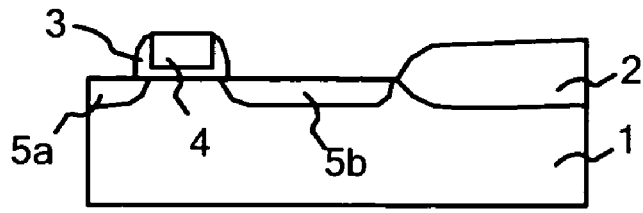
FIGS. 1A to 1K are a process diagram showing an example of the method of the semiconductor device of the present invention containing the silica film of the present invention.

DESCRIPTION OF THE PREFERRED EMBODIMENTS (Silica Film Forming Material)

The silica film forming material according to the present invention contains at least a silicone polymer that has, as part of the structure, CHx, an Si—O—Si bond, an Si—CH$_3$ bond and an Si—CHx- bond, and an organic solvent and other components as needed.

—Silicone Polymer—

It is necessary for the silicone polymer to contain CHx, an Si—O—Si bond, an Si—CH$_3$ bond and an Si—CHx- bond as part of its structure. Here, x represents an integer of 0 to 2. In this case, a silica film forming material with excellent etching resistance, chemical resistance, moisture resistance and adhesiveness is obtained.

The method for verification of the presence of CHx, an Si—O—Si bond, an Si—CH$_3$ bond and an Si—CHx- bond in the silicone polymer is not particularly limited, and may be appropriately selected according to the object. In fact, containment of all of the structures may be confirmed through use of an infrared spectrum analyzer to measure the absorption peaks.

The silicone polymer is not particularly limited, and may be appropriately selected according to the object. Preferably, the silicone polymer is obtained by the hydrolysis contraction polymerization reaction of at least one of silicon compounds expressed by the following general formulas (1) to (3), and at least one of silicon compounds expressed by the following general formulas (4) to (7).

The silicon compounds expressed by the general following formulas (1) to (3) contain hydrocarbon or aromatic hydrocarbon in its skeleton, which can provide the silicone polymer with the properties such as etching resistance, chemical resistance, moisture resistance and the like. Moreover, the silicon compounds expressed by the following general formulas (4) to (7) can provide the silicone polymer with the properties such as mechanical strength and adhesiveness with the underlying layer.

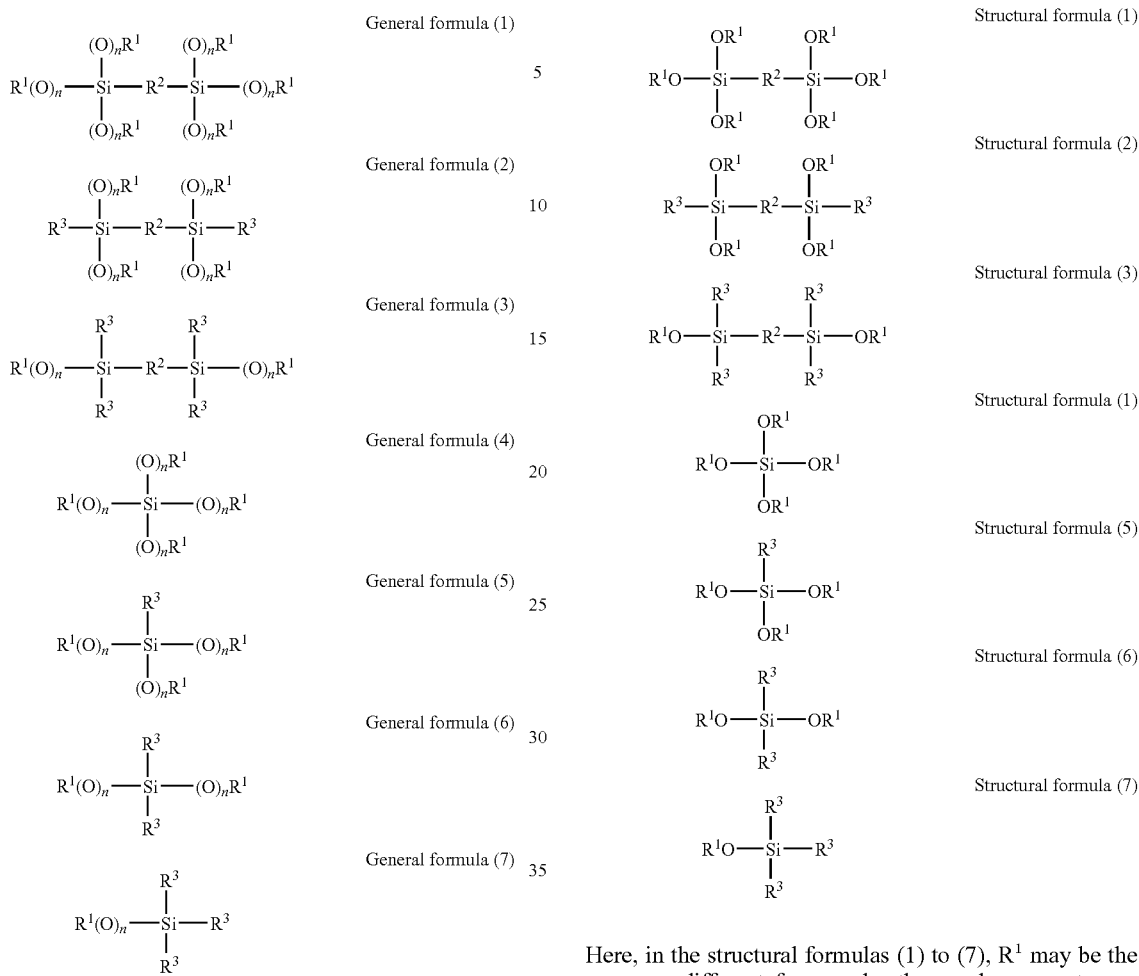

Here, in the general formulas (1) to (7), n represents either 0 or 1. $R^1$ may be the same as or different from each other. When n=0, $R^1$ represents one selected from the group consisting of a chlorine atom, a bromine atom, a fluorine atom, and a hydrogen atom, and when n=1, $R^1$ represents one selected from the group consisting of a hydrocarbon with a carbon number of 1 to 4, an aromatic hydrocarbon, a hydrogen atom and a carboxyl group. $R^2$ represents one selected from the group consisting of a hydrocarbon with a carbon number of 1 to 4, an aromatic hydrocarbon, and a hydrogen atom. $R^3$ may be the same as or different from each other, and represents one selected from the group consisting of a hydrocarbon with a carbon number of 1 to 3 and an aromatic hydrocarbon.

A combination of the silicon compounds to be used for the hydrolysis contraction polymerization reaction varies with the value of n in general formulas (1) to (7), but the following concrete combinations may be provided depending on whether n is 1 or 0.

When n=1 in the general formulas (1) to (7), the combination of at least one of the silicon compounds expressed by the following structural formulas (1) to (3), and at least one of the silicon compounds expressed by the following structural formulas (4) to (7) may be suitably used.

Here, in the structural formulas (1) to (7), $R^1$ may be the same as or different from each other, and represents one selected from the group consisting of a hydrocarbon with a carbon number of 1 to 4, an aromatic hydrocarbon, a hydrogen atom, and a carboxyl group. $R^2$ represents one selected from the group consisting of a hydrocarbon with a carbon number of 1 to 4, an aromatic hydrocarbon, and a hydrogen atom. $R^3$ may be the same as or different from each other, and represents one selected from the group consisting of a hydrocarbon with a carbon number of 1 to 3 and an aromatic hydrocarbon.

The silicon compound expressed by the structural formula (1) is not particularly limited, and may be appropriately selected according to the object. Specific examples thereof include:
bis(trimethoxysilyl)methane,
bis(triethoxysilyl)methane,
1,2-bis(triethoxysilyl)ethane,
1,3-bis(triethoxysilyl)propane,
1,4-bis(triethoxysilyl)butane,
1,4-bis(triethoxysilyl)benzene,
bis(tripropoxysilyl)methane,
1,2-bis(tripropoxysilyl)ethane,
1,3-bis(tripropoxysilyl)propane,
1,4-bis(tripropoxysilyl)butane,
1,4-bis(tripropoxysilyl)benzene,
bis(triisopropoxysilyl)methane,
1,2-bis(triisopropoxysilyl)ethane,
1,3-bis(triisopropoxysilyl)propane, 1,4-bis(triisopropoxysilyl)butane,
1,4-bis(triisopropoxysilyl)benzene,
bis(tributoxysilyl)methane,
bis(tri-tert-butoxysilyl)methane,
1,2-bis(tri-tert-butoxysilyl)ethane,
1,3-bis(tri-tert-butoxysilyl)propane,
1,4-bis(tri-tert-butoxysilyl)butane,
1,4-bis(tri-tert-butoxysilyl)benzene,
bis(triacetoxysilyl)methane,
1,2-bis(triacetoxysilyl)ethane,
1,3-bis(triacetoxysilyl)propane,
1,4-bis(triacetoxysilyl)butane,
1,4-bis(triacetoxysilyl)benzene,
bis(triphenoxysilyl)methane,
1,2-bis(triphenoxysilyl)ethane,
1,3-bis(triphenoxysilyl)propane,
1,4-bis(triphenoxysilyl)butane,
1,4-bis(triphenoxysilyl)benzene.

These compounds may be used alone or in combination of 2 or more.

The silicon compound expressed by the structural formula (2) is not particularly limited, and may be appropriately selected in accordance with the object. Specific examples thereof include:
bis(dimethoxymethylsilyl)methane,
1,2-bis(dimethoxymethylsilyl)ethane,
1,3-bis(dimethoxymethylsilyl)propane,
1,4-bis(dimethoxymethylsilyl)butane,
1,4-bis(dimethoxymethylsilyl)benzene,
bis(diethoxymethylsilyl)methane,
1,2-bis(diethoxymethylsilyl)ethane,
1,3-bis(diethoxymethylsilyl)propane,
1,4-bis(diethoxymethylsilyl)butane,
1,4-bis(diethoxymethylsilyl)benzene,
bis(dipropoxymethylsilyl)methane,
1,2-bis(dipropoxymethylsilyl)ethane,
1,3-bis(dipropoxymethylsilyl)propane,
1,4-bis(dipropoxymethylsilyl)butane,
1,4-bis(dipropoxymethylsilyl)benzene,
bis (diisopropoxymethylsilyl) methane,
1,2-bis(diisopropoxymethylsilyl)ethane,
1,3-bis(diisopropoxymethylsilyl)propane,
1,4-bis(diisopropoxymethylsilyl)butane,
1,4-bis(diisopropoxymethylsilyl)benzene,
bis(dimethoxyethylsilyl)methane,
1,2-bis(dimethoxyethylsilyl)ethane,
1,3-bis(dimethoxyethylsilyl)propane,
1,4-bis(dimethoxyethylsilyl)butane,
1,4-bis(dimethoxyethylsilyl)benzene,
bis(diethoxyethylsilyl)methane,
1,2-bis(diethoxyethylsilyl)ethane,
1,3-bis(diethoxyethylsilyl)propane,
1,4-bis(diethoxyethylsilyl)butane,
1,4-bis(diethoxyethylsilyl)benzene,
bis(dipropoxyethylsilyl) methane,
1,2-bis(dipropoxyethylsilyl)ethane,
1,3-bis(dipropoxyethylsilyl)propane,
1,4-bis(dipropoxyethylsilyl)butane,
1,4-bis(dipropoxyethylsilyl)benzene,
bis(diisopropoxyethylsilyl) methane,
1,2-bis(diisopropoxyethylsilyl)ethane,
1,3-bis(diisopropoxyethylsilyl)propane,
1,4-bis(diisopropoxyethylsilyl)butane,
1,4-bis(diisopropoxyethylsilyl)benzene,
bis(dimethoxypropylsilyl)methane,
1,2-bis(dimethoxypropylsilyl)ethane,
1,3-bis(dimethoxypropylsilyl)propane,
1,4-bis(dimethoxypropylsilyl)butane,
1,4-bis(dimethoxypropylsilyl)benzene,
bis(diethoxypropylsilyl)methane,
1,2-bis(diethoxypropylsilyl)ethane,
1,3-bis(diethoxypropylsilyl)propane,
1,4-bis(diethoxypropylsilyl)butane,
1,4-bis(diethoxypropylsilyl)benzene,
bis(dipropoxypropylsilyl)methane,
1,2-bis(dipropoxypropylsilyl)ethane,
1,3-bis(dipropoxypropylsilyl)propane,
1,4-bis(dipropoxypropylsilyl)butane,
1,4-bis(dipropoxypropylsilyl)benzene,
bis (diisopropoxypropylsilyl) methane,
1,2-bis(diisopropoxypropylsilyl)ethane,
1,3-bis(diisopropoxypropylsilyl)propane,
1,4-bis(diisopropoxypropylsilyl)butane,
1,4-bis(diisopropoxypropylsilyl)benzene,
bis(dimethoxyisopropylsilyl)methane,
1,2-bis(dimethoxyisopropylsilyl)ethane,
1,3-bis(dimethoxyisopropylsilyl)propane,
1,4-bis(dimethoxyisopropylsilyl)butane,
1,4-bis(dimethoxyisopropylsilyl)benzene,
bis(diethoxyisopropylsilyl) methane,
1,2-bis(diethoxyisopropylsilyl)ethane,
1,3-bis(diethoxyisopropylsilyl)propane,
1,4-bis(diethoxyisopropylsilyl)butane,
1,4-bis(diethoxyisopropylsilyl)benzene,
bis(dipropoxyisopropylsilyl)methane,
1,2-bis(dipropoxyisopropylsilyl)ethane,
1,3-bis(dipropoxyisopropylsilyl)propane,
1,4-bis(dipropoxyisopropylsilyl)butane,
1,4-bis(dipropoxyisopropylsilyl)benzene,
bis(diisopropoxyisopropylsilyl)methane,
1,2-bis(diisopropoxyisopropylsilyl)ethane,
1,3-bis(diisopropoxyisopropylsilyl)propane,
1,4-bis(diisopropoxyisopropylsilyl)butane,
1,4-bis(diisopropoxyisopropylsilyl)benzene,
bis(dimethoxybutylsilyl)methane,
1,2-bis(dimethoxybutylsilyl)ethane,
1,3-bis(dimethoxybutylsilyl)propane,
1,4-bis(dimethoxybutylsilyl)butane,
1,4-bis(dimethoxybutylsilyl)benzene,
bis(diethoxybutylsilyl)methane,
1,2-bis(diethoxybutylsilyl)ethane,
1,3-bis(diethoxybutylsilyl)propane,
1,4-bis(diethoxybutylsilyl)butane,
1,4-bis(diethoxybutylsilyl)benzene,
bis(dipropoxybutylsilyl) methane,
1,2-bis(dipropoxybutylsilyl)ethane,
1,3-bis(dipropoxybutylsilyl)propane,
1,4-bis(dipropoxybutylsilyl)butane,
1,4-bis(dipropoxybutylsilyl)benzene,
bis (diisopropoxybutylsilyl) methane,
1,2-bis(diisopropoxybutylsilyl)ethane,
1,3-bis(diisopropoxybutylsilyl)propane,
1,4-bis(diisopropoxybutylsilyl)butane,
1,4-bis(diisopropoxybutylsilyl)benzene,
bis(dimethoxy-tert-butylsilyl) methane,
1,2-bis(dimethoxy-tert-butylsilyl)ethane,
1,3-bis(dimethoxy-tert-butylsilyl)propane,
1,4-bis(dimethoxy-tert-butylsilyl)butane,
1,4-bis(dimethoxy-tert-butylsilyl)benzene,
bis(diethoxy-tert-butylsilyl)methane,
1,2-bis(diethoxy-tert-butylsilyl)ethane,
1,3-bis(diethoxy-tert-butylsilyl)propane,
1,4-bis(diethoxy-tert-butylsilyl)butane,
1,4-bis(diethoxy-tert-butylsilyl)benzene, bis(dipropoxy-tert-butylsilyl)methane,
1,2-bis(dipropoxy-tert-butylsilyl)ethane,
1,3-bis(dipropoxy-tert-butylsilyl)propane,
1,4-bis(dipropoxy-tert-butylsilyl)butane,
1,4-bis(dipropoxy-tert-butylsilyl)benzene,
bis(diisopropoxy-tert-butylsilyl)methane,
1,2-bis(diisopropoxy-tert-butylsilyl)ethane,
1,3-bis(diisopropoxy-tert-butylsilyl)propane,
1,4-bis(diisopropoxy-tert-butylsilyl)butane,
1,4-bis(diisopropoxy-tert-butylsilyl)benzene,
bis(dimethoxyphenylsilyl)methane,
1,2-bis(dimethoxyphenylsilyl)ethane,
1,3-bis(dimethoxyphenylsilyl)propane,
1,4-bis(dimethoxyphenylsilyl)butane,
1,4-bis(dimethoxyphenylsilyl)benzene,
bis (diethoxyphenylsilyl) methane,
1,2-bis(diethoxyphenylsilyl)ethane,
1,3-bis(diethoxyphenylsilyl)propane,
1,4-bis(diethoxyphenylsilyl)butane,
1,4-bis(diethoxyphenylsilyl)benzene,
bis(dipropoxyphenylsilyl)methane,
1,2-bis(dipropoxyphenylsilyl)ethane,
1,3-bis(dipropoxyphenylsilyl)propane,
1,4-bis(dipropoxyphenylsilyl)butane,
1,4-bis(dipropoxyphenylsilyl)benzene,
bis(diisopropoxyphenylsilyl)methane,
1,2-bis(diisopropoxyphenylsilyl)ethane,
1,3-bis(diisopropoxyphenylsilyl)propane,
1,4-bis(diisopropoxyphenylsilyl)butane,
1,4-bis(diisopropoxyphenylsilyl)benzene,
bis(dibutoxymethylsilyl)methane,
1,2-bis(dibutoxymethylsilyl)ethane,
1,3-bis(dibutoxymethylsilyl)propane,
1,4-bis(dibutoxymethylsilyl)butane,
1,4-bis(dibutoxymethylsilyl)benzene,
bis(di-tert-butoxymethylsilyl)methane,
1,2-bis(di-tert-butoxymethylsilyl)ethane,
1,3-bis(di-tert-butoxymethylsilyl)propane,
1,4-bis(di-tert-butoxymethylsilyl)butane,
1,4-bis(di-tert-butoxymethylsilyl)benzene,
bis(diacetoxymethylsilyl) methane,
1,2-bis(diacetoxymethylsilyl)ethane,
1,3-bis(diacetoxymethylsilyl)propane,
1,4-bis(diacetoxymethylsilyl)butane,
1,4-bis(diacetoxymethylsilyl)benzene,
bis(diphenoxymethylsilyl) methane,
1,2-bis(diphenoxymethylsilyl)ethane,
1,3-bis(diphenoxymethylsilyl)propane,
1,4-bis(diphenoxymethylsilyl)butane,
1,4-bis(diphenoxymethylsilyl)benzene,
bis(dibutoxyethylsilyl)methane,
1,2-bis(dibutoxyethylsilyl)ethane,
1,3-bis(dibutoxyethylsilyl)propane,
1,4-bis(dibutoxyethylsilyl)butane,
1,4-bis(dibutoxyethylsilyl)benzene,
bis(di-tert-btoxyethylsilyl)methane,
1,2-bis(di-tert-btoxyethylsilyl)ethane,
1,3-bis(di-tert-btoxyethylsilyl)propane,
1,4-bis(di-tert-btoxyethylsilyl)butane,
1,4-bis(di-tert-btoxyethylsilyl)benzene,
bis(diacetoxyethylsilyl)methane,
1,2-bis(diacetoxyethylsilyl)ethane,
1,3-bis(diacetoxyethylsilyl)propane,
1,4-bis(diacetoxyethylsilyl)butane,
1,4-bis(diacetoxyethylsilyl)benzene,
bis(diphenoxyethylsilyl)methane,
1,2-bis(diphenoxyethylsilyl)ethane,
1,3-bis(diphenoxyethylsilyl)propane,
1,4-bis(diphenoxyethylsilyl)butane,
1,4-bis(diphenoxyethylsilyl)benzene,
bis(dibutoxypropylsilyl) methane,
1,2-bis(dibutoxypropylsilyl)ethane,
1,3-bis(dibutoxypropylsilyl)propane,
1,4-bis(dibutoxypropylsilyl)butane,
1,4-bis(dibutoxypropylsilyl)benzene,
bis(di-tert-butoxypropylsilyl) methane,
1,2-bis(di-tert-butoxypropylsilyl)ethane,
1,3-bis(di-tert-butoxypropylsilyl)propane,
1,4-bis(di-tert-butoxypropylsilyl)butane,
1,4-bis(di-tert-butoxypropylsilyl)benzene,
bis(diacetoxypropylsilyl)methane,
1,2-bis(diacetoxypropylsilyl)ethane,
1,3-bis(diacetoxypropylsilyl)propane,
1,4-bis(diacetoxypropylsilyl)butane,
1,4-bis(diacetoxypropylsilyl)benzene,
bis (diphenoxypropylsilyl) methane,
1,2-bis(diphenoxypropylsilyl)ethane,
1,3-bis(diphenoxypropylsilyl)propane,
1,4-bis(diphenoxypropylsilyl)butane,
1,4-bis(diphenoxypropylsilyl)benzene,
bis(dibutoxyisopropylsilyl)methane,
1,2-bis(dibutoxyisopropylsilyl)ethane,
1,3-bis(dibutoxyisopropylsilyl)propane,
1,4-bis(dibutoxyisopropylsilyl)butane,
1,4-bis(dibutoxyisopropylsilyl)benzene,
bis(di-tert-butoxyisopropylsilyl)methane,
1,2-bis(di-tert-butoxyisopropylsilyl)ethane,
1,3-bis(di-tert-butoxyisopropylsilyl)propane,
1,4-bis(di-tert-butoxyisopropylsilyl)butane,
1,4-bis(di-ter-tbutoxyisopropylsilyl)benzene,
bis(diacetoxyisopropylsilyl) methane,
1,2-bis(diacetoxyisopropylsilyl)ethane,
1,3-bis(diacetoxyisopropylsilyl)propane,
1,4-bis(diacetoxyisopropylsilyl)butane,
1,4-bis(diacetoxyisopropylsilyl)benzene,
bis(diphenoxyisopropylsilyl) methane,
1,2-bis(diphenoxyisopropylsilyl)ethane,
1,3-bis(diphenoxyisopropylsilyl)propane,
1,4-bis(diphenoxyisopropylsilyl)butane,
1,4-bis(diphenoxyisopropylsilyl)benzene,
bis(dibutoxybutylsilyl) methane,
1,2-bis(dibutoxybutylsilyl)ethane,
1,3-bis(dibutoxybutylsilyl)propane,
1,4-bis(dibutoxybutylsilyl)butane,
1,4-bis(dibutoxybutylsilyl)benzene,
bis(di-tert-butoxybutylsilyl)methane,
1,2-bis(di-tert-butoxybutylsilyl)ethane,
1,3-bis(di-tert-butoxybutylsilyl)propane,
1,4-bis(di-tert-butoxybutylsilyl)butane,
1,4-bis(di-tert-butoxybutylsilyl)benzene,
bis(diacetoxybutylsilyl)methane,
1,2-bis(diacetoxybutylsilyl)ethane,
1,3-bis(diacetoxybutylsilyl)propane,
1,4-bis(diacetoxybutylsilyl)butane,
1,4-bis(diacetoxybutylsilyl)benzene,
bis(diphoxybutylsilyl) methane,
1,2-bis(diphoxybutylsilyl)ethane,
1,3-bis(diphoxybutylsilyl)propane,
1,4-bis(diphoxybutylsilyl)butane,
1,4-bis(diphoxybutylsilyl)benzene,
bis (dibutoxyphenylsilyl) methane,
1,2-bis(dibutoxyphenylsilyl)ethane,
1,3-bis(dibutoxyphenylsilyl)propane,
1,4-bis(dibutoxyphenylsilyl)butane, 1,4-bis(dibutoxyphenylsilyl)benzene,
bis(di-tert-butoxyphenylsilyl) methane,
1,2-bis(di-tert-butoxyphenylsilyl)ethane,
1,3-bis(di-tert-butoxyphenylsilyl)propane,
1,4-bis(di-tert-butoxyphenylsilyl)butane,
1,4-bis(ditertbutoxyphenylsilyl)benzene,
bis (diacetoxyphenylsilyl) methane,
1,2-bis(diacetoxyphenylsilyl)ethane,
1,3-bis(diacetoxyphenylsilyl)propane,
1,4-bis(diacetoxyphenylsilyl)butane,
1,4-bis(diacetoxyphenylsilyl)benzene,
bis(diphenoxyphenylsilyl)methane,
1,2-bis(diphenoxyphenylsilyl)ethane,
1,3-bis(diphenoxyphenylsilyl)propane,
1,4-bis(diphenoxyphenylsilyl)butane, and
1,4-bis(diphenoxyphenylsilyl)benzene.

These compounds may be used alone or in combination of 2 or more.

The silicon compound expressed by the structural formula (3) is not particularly limited, and may be appropriately selected in accordance with the objective. Specific examples thereof include: bis(dimethylmethoxysilyl)methane,
1,2-bis(dimethylmethoxysilyl)ethane,
1,3-bis(dimethylmethoxysilyl)propane,
1,4-bis(dimethylmethoxysilyl)butane,
1,4-bis(dimethylmethoxysilyl)benzene,
bis(dimethylethoxysilyl)methane,
1,2-bis(dimethylethoxysilyl)ethane,
1,3-bis(dimethylethoxysilyl)propane,
1,4-bis(dimethylethoxysilyl)butane,
1,4-bis(dimethylethoxysilyl)benzene,
bis(dimethylpropoxysilyl)methane,
1,2-bis(dimethylpropoxysilyl)ethane,
1,3-bis(dimethylpropoxysilyl)propane,
1,4-bis(dimethylpropoxysilyl)butane,
1,4-bis(dimethylpropoxysilyl)benzene,
bis(dimethylisopropoxysilyl)methane,
1,2-bis(dimethylisopropoxysilyl)ethane,
1,3-bis(dimethylisopropoxysilyl)propane,
1,4-bis(dimethylisopropoxysilyl)butane,
1,4-bis(dimethylisopropoxysilyl)benzene,
bis(diethylmethoxysilyl) methane,
1,2-bis(diethylmethoxysilyl)ethane,
1,3-bis(diethylmethoxysilyl)propane,
1,4-bis(diethylmethoxysilyl)butane,
1,4-bis(diethylmethoxysilyl)benzene,
bis(diethylethoxysilyl) methane,
1,2-bis(diethylethoxysilyl)ethane,
1,3-bis(diethylethoxysilyl)propane,
1,4-bis(diethylethoxysilyl)butane,
1,4-bis(diethylethoxysilyl)benzene,
bis(diethylpropoxysilyl)methane,
1,2-bis(diethylpropoxysilyl)ethane,
1,3-bis(diethylpropoxysilyl)propane,
1,4-bis(diethylpropoxysilyl)butane,
1,4-bis(diethylpropoxysilyl)benzene,
bis(diethylisopropoxysilyl)methane,
1,2-bis(diethylisopropoxysilyl)ethane,
1,3-bis(diethylisopropoxysilyl)propane,
1,4-bis(diethylisopropoxysilyl)butane,
1,4-bis(diethylisopropoxysilyl)benzene,
bis(dipropylmethoxysilyl) methane,
1,2-bis(dipropylmethoxysilyl)ethane,
1,3-bis(dipropylmethoxysilyl)propane,
1,4-bis(dipropylmethoxysilyl)butane,
1,4-bis(dipropylmethoxysilyl)benzene,
bis(dipropylethoxysilyl)methane,
1,2-bis(dipropylethoxysilyl)ethane,
1,3-bis(dipropylethoxysilyl)propane,
1,4-bis(dipropylethoxysilyl)butane,
1,4-bis(dipropylethoxysilyl)benzene,
bis (dipropylpropoxysilyl) methane,
1,2-bis(dipropylpropoxysilyl)ethane,
1,3-bis(dipropylpropoxysilyl)propane,
1,4-bis(dipropylpropoxysilyl)butane,
1,4-bis(dipropylpropoxysilyl)benzene,
bis (dipropylisopropoxysilyl) methane,
1,2-bis(dipropylisopropoxysilyl)ethane,
1,3-bis(dipropylisopropoxysilyl)propane,
1,4-bis(dipropylisopropoxysilyl)butane,
1,4-bis(dipropylisopropoxysilyl)benzene,
bis(diisopropylmethoxysilyl)methane,
1,2-bis(diisopropylmethoxysilyl)ethane,
1,3-bis(diisopropylmethoxysilyl)propane,
1,4-bis(diisopropylmethoxysilyl)butane,
1,4-bis(diisopropylmethoxysilyl)benzene,
bis(diisopropylethoxysilyl)methane,
1,2-bis(diisopropylethoxysilyl)ethane,
1,3-bis(diisopropylethoxysilyl)propane,
1,4-bis(diisopropylethoxysilyl)butane,
1,4-bis(diisopropylethoxysilyl)benzene,
bis(diisopropylpropoxysilyl)methane,
1,2-bis(diisopropylpropoxysilyl)ethane,
1,3-bis(diisopropylpropoxysilyl)propane,
1,4-bis(diisopropylpropoxysilyl)butane,
1,4-bis(diisopropylpropoxysilyl)benzene,
bis(diisopropylisopropoxysilyl)methane,
1,2-bis(diisopropylisopropoxysilyl)ethane,
1,3-bis(diisopropylisopropoxysilyl)propane,
1,4-bis(diisopropylisopropoxysilyl)butane,
1,4-bis(diisopropylisopropoxysilyl)benzene,
bis(dibutylmethoxysilyl)methane,
1,2-bis(dibutylmethoxysilyl)ethane,
1,3-bis(dibutylmethoxysilyl)propane,
1,4-bis(dibutylmethoxysilyl)butane,
1,4-bis(dibutylmethoxysilyl)benzene,
bis(dibutylethoxysilyl)methane,
1,2-bis(dibutylethoxysilyl)ethane,
1,3-bis(dibutylethoxysilyl)propane,
1,4-bis(dibutylethoxysilyl)butane,
1,4-bis(dibutylethoxysilyl)benzene,
biutyls (dibutylpropoxysilyl) methane,
1,2-bis(dibutylpropoxysilyl)ethane,
1,3-bis(dibutylpropoxysilyl)propane,
1,4-bis(dibutylpropoxysilyl)butane,
1,4-bis(dibutylpropoxysilyl)benzene,
bis (dibutylisopropoxysilyl) methane,
1,2-bis(dibutylisopropoxysilyl)ethane,
1,3-bis(dibutylisopropoxysilyl)propane,
1,4-bis(dibutylisopropoxysilyl)butane,
1,4-bis(dibutylisopropoxysilyl)benzene,
bis(di-tert-butylmethoxysilyl)methane,
1,2-bis(di-tert-butylmethoxysilyl)ethane,
1,3-bis(di-tert-butylmethoxysilyl)propane,
1,4-bis(di-tert-butylmethoxysilyl)butane,
1,4-bis(di-tert-butylmethoxysilyl)benzene,
bis(di-tert-butylethoxysilyl)methane,
1,2-bis(di-tert-butylethoxysilyl)ethane,
1,3-bis(di-tert-butylethoxysilyl)propane,
1,4-bis(di-tert-butylethoxysilyl)butane,
1,4-bis(di-tert-butylethoxysilyl)benzene,
bis(di-tert-butylpropoxysilyl)methane,
1,2-bis(di-tert-butylpropoxysilyl)ethane,
1,3-bis(di-tert-butylpropoxysilyl)propane, 1,4-bis(di-tert-butylpropoxysilyl)butane,
1,4-bis(di-tert-butylpropoxysilyl)benzene,
bis(di-tert-butylisopropoxysilyl)methane,
1,2-bis(di-tert-butylisopropoxysilyl)ethane,
1,3-bis(di-tert-butylisopropoxysilyl)propane,
1,4-bis(di-tert-butylisopropoxysilyl)butane,
1,4-bis(di-tert-butylisopropoxysilyl)benzene,
bis(diphenylmethoxysilyl)methane,
1,2-bis(diphenylmethoxysilyl)ethane,
1,3-bis(diphenylmethoxysilyl)propane,
1,4-bis(diphenylmethoxysilyl)butane,
1,4-bis(diphenylmethoxysilyl)benzene,
bis(diphenylethoxysilyl)methane,
is 1,2-bis(diphenylethoxysilyl)ethane,
1,3-bis(diphenylethoxysilyl)propane,
1,4-bis(diphenylethoxysilyl)butane,
1,4-bis(diphenylethoxysilyl)benzene,
bis(diphenylpropoxysilyl)methane,
1,2-bis(diphenylpropoxysilyl)ethane,
1,3-bis(diphenylpropoxysilyl)propane,
1,4-bis(diphenylpropoxysilyl)butane,
1,4-bis(diphenylpropoxysilyl)benzene,
bis(diphenylisopropoxysilyl) methane,
1,2-bis(diphenylisopropoxysilyl)ethane,
1,3-bis(diphenylisopropoxysilyl)propane,
1,4-bis(diphenylisopropoxysilyl)butane,
1,4-bis(diphenylisopropoxysilyl)benzene,
bis(dimethylbutoxysilyl)methane,
1,2-bis(dimethylbutoxysilyl)ethane,
1,3-bis(dimethylbutoxysilyl)propane,
1,4-bis(dimethylbutoxysilyl)butane,
1,4-bis(dimethylbutoxysilyl)benzene,
bis(dimethyl-tert-butoxysilyl) methane,
1,2-bis(dimethyl-tert-butoxysilyl)ethane,
1,3-bis(dimethyl-tert-butoxysilyl)propane,
1,4-bis(dimethyl-tert-butoxysilyl)butane,
1,4-bis(dimethyl-tert-butoxysilyl)benzene,
bis (dimethylacetoxysilyl) methane,
1,2-bis(dimethylacetoxysilyl)ethane,
1,3-bis(dimethylacetoxysilyl)propane,
1,4-bis(dimethylacetoxysilyl)butane,
1,4-bis(dimethylacetoxysilyl)benzene,
bis(dimethylphenoxysilyl)methane,
1,2-bis(dimethylphenoxysilyl)ethane,
1,3-bis(dimethylphenoxysilyl)propane,
1,4-bis(dimethylphenoxysilyl)butane,
1,4-bis(dimethylphenoxysilyl)benzene,
bis (diethylbutoxysilyl) methane,
1,2-bis(diethylbutoxysilyl)ethane,
1,3-bis(diethylbutoxysilyl)propane,
1,4-bis(diethylbutoxysilyl)butane,
1,4-bis(diethylbutoxysilyl)benzene,
bis(diethyl-tert-butoxysilyl)methane,
1,2-bis(diethyl-tert-butoxysilyl)ethane,
1,3-bis(diethyl-tert-butoxysilyl)propane,
1,4-bis(diethyl-tert-butoxysilyl)butane,
1,4-bis(diethyl-tert-butoxysilyl)benzene,
bis(diethylacetoxysilyl)methane,
1,2-bis(diethylacetoxysilyl)ethane,
1,3-bis(diethylacetoxysilyl)propane,
1,4-bis(diethylacetoxysilyl)butane,
1,4-bis(diethylacetoxysilyl)benzene,
bis(diethylphenoxysilyl) methane,
1,2-bis(diethylphenoxysilyl)ethane,
1,3-bis(diethylphenoxysilyl)propane,
1,4-bis(diethylphenoxysilyl)butane,
1,4-bis(diethylphenoxysilyl)benzene,
bis(dipropylbutoxysilyl)methane,
1,2-bis(dipropylbutoxysilyl)ethane,
1,3-bis(dipropylbutoxysilyl)propane,
1,4-bis(dipropylbutoxysilyl)butane,
1,4-bis(dipropylbutoxysilyl)benzene,
bis(dipropyl-tert-butoxysilyl)methane,
1,2-bis(dipropyltertbutoxysilyl)ethane,
1,3-bis(dipropyltertbutoxysilyl)propane,
1,4-bis(dipropyltertbutoxysilyl)butane,
1,4-bis(dipropyltertbutoxysilyl)benzene,
bis(dipropylacetoxysilyl)methane,
1,2-bis(dipropylacetoxysilyl)ethane,
1,3-bis(dipropylacetoxysilyl)propane,
1,4-bis(dipropylacetoxysilyl)butane,
1,4-bis(dipropylacetoxysilyl)benzene,
bis(dipropylphenoxysilyl) methane,
1,2-bis(dipropylphenoxysilyl)ethane,
1,3-bis(dipropylphenoxysilyl)propane,
1,4-bis(dipropylphenoxysilyl)butane,
1,4-bis(dipropylphenoxysilyl)benzene,
bis(diisopropylbutoxysilyl) methane,
1,2-bis(diisopropylbutoxysilyl)ethane,
1,3-bis(diisopropylbutoxysilyl)propane,
1,4-bis(diisopropylbutoxysilyl)butane,
1,4-bis(diisopropylbutoxysilyl)benzene,
bis (diisopropyl-tert-butoxysilyl)methane,
1,2-bis(diisopropyltertbutoxysilyl)ethane,
1,3-bis(diisopropyltertbutoxysilyl)propane,
1,4-bis(diisopropyltertbutoxysilyl)butane,
1,4-bis(diisopropyltertbutoxysilyl)benzene,
bis(diisopropylacetoxysilyl) methane,
1,2-bis(diisopropylacetoxysilyl)ethane,
1,3-bis(diisopropylacetoxysilyl)propane,
1,4-bis(diisopropylacetoxysilyl)butane,
1,4-bis(diisopropylacetoxysilyl)benzene,
bis(diisopropylphenoxysilyl)methane,
1,2-bis(diisopropylphenoxysilyl)ethane,
1,3-bis(diisopropylphenoxysilyl)propane,
1,4-bis(diisopropylphenoxysilyl)butane,
1,4-bis(diisopropylphenoxysilyl)benzene,
bis(dibutylbutoxysilyl)methane,
1,2-bis(dibutylbutoxysilyl)ethane,
1,3-bis(dibutylbutoxysilyl)propane,
1,4-bis(dibutylbutoxysilyl)butane,
1,4-bis(dibutylbutoxysilyl)benzene,
bis (dibutyl-tert-butoxysilyl) methane,
1,2-bis(dibutyl-tert-butoxysilyl)ethane,
1,3-bis(dibutyl-tert-butoxysilyl)propane,
1,4-bis(dibutyl-tert-butoxysilyl)butane,
1,4-bis(dibutyl-tert-butoxysilyl)benzene,
bis(dibutylacetoxysilyl)methane,
1,2-bis(dibutylacetoxysilyl)ethane,
1,3-bis(dibutylacetoxysilyl)propane,
1,4-bis(dibutylacetoxysilyl)butane,
1,4-bis(dibutylacetoxysilyl)benzene,
bis(dibutylphenoxysilyl)methane,
1,2-bis(dibutylphenoxysilyl)ethane,
1,3-bis(dibutylphenoxysilyl)propane,
1,4-bis(dibutylphenoxysilyl)butane,
1,4-bis(dibutylphenoxysilyl)benzene,
bis(di-tert-butylbutoxysilyl)methane,
1,2-bis(di-tert-butylbutoxysilyl)ethane,
1,3-bis(di-tert-butylbutoxysilyl)propane,
1,4-bis(di-tert-butylbutoxysilyl)butane,
1,4-bis(di-tert-butylbutoxysilyl)benzene,
bis(di-tert-butyl-tert-butoxysilyl)methane,
1,2-bis(di-tert-butyl-tert-butoxysilyl)ethane, 1,3-bis(di-tert-butyl-tert-butoxysilyl)propane,
1,4-bis(di-tert-butyl-tert-butoxysilyl)butane,
1,4-bis(di-tert-butyl-tert-butoxysilyl)benzene,
bis(di-tert-butylacetoxysilyl) methane,
1,2-bis(di-tert-butylacetoxysilyl)ethane,
1,3-bis(di-tert-butylacetoxysilyl)propane,
1,4-bis(di-tert-butylacetoxysilyl)butane,
1,4-bis(di-tert-butylacetoxysilyl)benzene,
bis(di-tert-butylphenoxysilyl)methane,
1,2-bis(di-tert-butylphenoxysilyl)ethane,
1,3-bis(di-tert-butylphenoxysilyl)propane,
1,4-bis(di-tert-butylphenoxysilyl)butane,
1,4-bis(di-tert-butylphenoxysilyl)benzene,
bis(dibutoxy-tert-butylsilyl) methane,
1,2-bis(dibutoxy-tert-butylsilyl)ethane,
1,3-bis(dibutoxy-tert-butylsilyl)propane,
1,4-bis(dibutoxy-tert-butylsilyl)butane,
1,4-bis(dibutoxy-tert-butylsilyl)benzene,
bis(di-tert-butoxy-tert-butylsilyl)methane,
1,2-bis(di-tert-butoxy-tert-butylsilyl)ethane,
1,3-bis(di-tert-butoxy-tert-butylsilyl)propane,
1,4-bis(di-tert-butoxy-tert-butylsilyl)butane,
1,4-bis(di-tert-butoxy-tert-butylsilyl)benzene,
bis(diacetoxy-tert-butylsilyl)methane,
1,2-bis(diacetoxy-tert-butylsilyl)ethane,
1,3-bis(diacetoxy-tert-butylsilyl)propane,
1,4-bis(diacetoxy-tert-butylsilyl)butane,
1,4-bis(diacetoxy-tert-butylsilyl)benzene,
bis(diphenoxy-tert-butylsilyl)methane,
1,2-bis(diphenoxy-tert-butylsilyl)ethane,
1,3-bis(diphenoxy-tert-butylsilyl)propane,
1,4-bis(diphenoxy-tert-butylsilyl)butane,
1,4-bis(diphenoxy-tert-butylsilyl)benzene,
bis(diphenylbutoxysilyl)methane,
1,2-bis(diphenylbutoxysilyl)ethane,
1,3-bis(diphenylbutoxysilyl)propane,
1,4-bis(diphenylbutoxysilyl)butane,
1,4-bis(diphenylbutoxysilyl)benzene,
bis(diphenyl-tert-butoxysilyl)methane,
1,2-bis(diphenyl-tert-butoxysilyl)ethane,
1,3-bis(diphenyl-tert-butoxysilyl)propane,
1,4-bis(diphenyl-tert-butoxysilyl)butane,
1,4-bis(diphenyl-tert-butoxysilyl)benzene,
bis(diphenylacetoxysilyl)methane,
1,2-bis(diphenylacetoxysilyl)ethane,
1,3-bis(diphenylacetoxysilyl)propane,
1,4-bis(diphenylacetoxysilyl)butane,
1,4-bis(diphenylacetoxysilyl)benzene,
bis (diphenylphenoxysilyl) methane,
1,2-bis(diphenylphenoxysilyl)ethane,
1,3-bis(diphenylphenoxysilyl)propane,
1,4-bis(diphenylphenoxysilyl)butane, and
1,4-bis(diphenylphenoxysilyl)benzene.

These compounds may be used alone or in combination of 2 or more.

The silicon compound expressed by the structural formula (4) is not particularly limited, and may be appropriately selected in accordance with the object. Specific examples thereof include tetramethoxysilane, tetraethoxysilane, tetrapropoxysilane, tetraisopropoxysilane, tetrabutoxysilane, tetra-tert-butoxysilane, tetraacetoxysilane, and tetraphenoxysilane. These compounds may be used alone or in combination of 2 or more.

The silicon compound expressed in the structural formula (5) is not particularly limited, and may be appropriately selected in accordance with the object. Specific examples thereof include methyltrimethoxysilane, ethyltrimethoxysilane, Propyltrimethoxysilane, isopropyltrimethoxysilane, butyltrimethoxysilane, tert-butyl-trimethoxysilane, phenyltrimethoxysilane, phenylmethyldimethoxysilane, Trimethoxysilane, methyltriethoxysilane, ethyltriethoxysilane, propyltriethoxysilane, isopropyltriethoxysilane, butyltriethoxysilane, tert-butyl-triethoxysilane, phenyltriethoxysilane, triethoxysilane, methyltripropoxysilane, ethyltripropoxysilane, propyltripropoxysilane, isopropyltripropoxysilane, butyltripropoxysilane, tert-butyl-tripropoxysilane, phenyltripropoxysilane, tripropoxysilane, methyltriisopropoxysilane, ethyltriisopropoxysilane, propyltriisopropoxysilane, isopropyltriisopropoxysilane, tert-butyl-triisopropoxysilane, phenyltriisopropoxysilane, triisopropoxysilane, methyltributoxysilane, ethyltributoxysilane, propyltributoxysilane, isopropyltributoxysilane, butyltributoxysilane, tert-butyl-tributoxysilane, phenyltributoxysilane, tributoxysilane, ethyl(tri-tert-butoxysilane), propyl(tri-tert-butoxysilane), isopropyl(tri-tert-butoxysilane), butyl(tri-tert-butoxysilane), tert-butyl-tri-tert-butoxysilane, phenyl(tri-tert-butoxysilane), phenylmethyl(di-tert-butoxysilane), tri-tert-butoxysilane, methyltriacetoxysilane, ethyltriacetoxysilane, propyltriacetoxysilane, isopropyltriacetoxysilane, butyltriacetoxysilane, tert-butyl-triacetoxysilane, phenyltriacetoxysilane, triacetoxysilane, methyltriphenoxysilane, ethyltriphenoxysilane, propyltriphenoxysilane, isopropyltriphenoxysilane, butyltriphenoxysilane, tert-butyl-triphenoxysilane, phenyltriphenoxysilane, phenylpropyldiphenoxysilane, and triphenoxysilane. These compounds may be used alone or in combination of 2 or more.

The silicon compound expressed by the structural formula (6) is not particularly limited, and may be appropriately selected in accordance with the object. Specific examples thereof include dimethyldimethoxysilane, diethyldimethoxysilane, dipropyldimethoxysilane, diisopropyldimethoxysilane, dibutyldimethoxysilane, di-tert-butyl-dimethoxysilane, diphenyldimethoxysilane, dimethylphenylmethoxysilane, phenylethyldimethoxysilane, phenylpropyldimethoxysilane, phenylisopropyldimethoxysilane, phenylbutyldimethoxysilane, phenyl(tert-butyl)dimethoxysilane, dimethoxysilane, methyldimethoxysilane, ethyldimethoxysilane, propyldimethoxysilane, isopropyldimethoxysilane, butyldimethoxysilane, tert-butyl-dimethoxysilane, diphenyldimethoxysilane, dimethyldiethoxysilane, diethyldiethoxysilane, dipropyldiethoxysilane, diisopropyldiethoxysilane, dibutyldiethoxysilane, di-tert-butyl-diethoxysilane, diphenyldiethoxysilane, phenylmethyldiethoxysilane, phenylethyldiethoxysilane, phenylpropyldiethoxysilane, phenylisopropyldiethoxysilane, phenylbutyldiethoxysilane, phenyl(tert-butyl)diethoxysilane, diethoxysilane, methyldiethoxysilane, ethyldiethoxysilane, propyldiethoxysilane, isopropyldiethoxysilane, butyldiethoxysilane, tert-butyl-diethoxysilane, diphenyldiethoxysilane, dimethyldipropoxysilane, diethyldipropoxysilane, dipropyldipropoxysilane, diisopropyldipropoxysilane, dibutyldipropoxysilane, di-tert-butyl-dipropoxysilane, diphenyldipropoxysilane, phenylmethyldipropoxysilane, phenylethyldipropoxysilane, phenylpropyldipropoxysilane, phenylisopropyldipropoxysilane, phenylbutyldipropoxysilane, phenyl(tert-butyl)dipropoxysilane, dipropoxysilane, methyldipropoxysilane, ethyldipropoxysilane, propyldipropoxysilane, isopropyldipropoxysilane, butyldipropoxysilane, tert-butyl-dipropoxysilane, diphenyldipropoxysilane, dimethyldiisopropoxysilane, diethyldiisopropoxysilane, dipropyldiisopropoxysilane, diisopropyldiisopropoxysilane, dibutyldiisopropoxysilane, di-tert-butyl-diisopropoxysilane, diphenyldiisopropoxysilane, phenylmethyldiisopropoxysilane, phenylethyldiisopropoxysilane, phenylpropyldiisopropoxysilane, phenylisopropyldiisopropoxysilane, phenylbutyldiisopropoxysilane, phenyl(tert-butyl)diisopropoxysilane, diisopropoxysilane, methyldiisopropoxysilane, ethyldiisopropoxysilane, propyldiisopropoxysilane, isopropyldiisopropoxysilane, butyldiisopropoxysilane, tert-butyl-diisopropoxysilane, diphenyldiisopropoxysilane, dimethyldibutoxysilane, diethyldibutoxysilane, dipropyldibutoxysilane, diisopropyldibutoxysilane, dibutyldibutoxysilane, di-tert-butyl-dibutoxysilane, diphenyldibutoxysilane, phenylmethyldibutoxysilane, phenylethyldibutoxysilane, phenylpropyldibutoxysilane, phenylisopropyldibutoxysilane, phenylbutyldibutoxysilane, phenyl(tert-butyl)dibutoxysilane, dibutoxysilane, methyldibutoxysilane, ethyldibutoxysilane, propyldibutoxysilane, isopropyldibutoxysilane, butyldibutoxysilane, tert-butyl-dibutoxysilane, diphenyldibutoxysilane, diethyl(di-tert-butoxysilane), dipropyl(di-tert-butoxysilane), diisopropyl(di-tert-butoxysilane), dibutyl(di-tert-butoxysilane), di-tert-butyl-di-tert-butoxysilane, diphenyl(di-tert-butoxysilane), phenylethyl(di-tert-butoxysilane), phenylpropyl(di-tert-butoxysilane), phenylisopropyl(di-tert-butoxysilane), phenylbutyl(di-tert-butoxysilane), phenyl(tert-butyl)(di-tert-butoxysilane), di-tert-butoxysilane, methyl(di-tert-butoxysilane), ethyl(di-tert-butoxysilane), propyl(di-tert-butoxysilane), isopropyl(di-tert-butoxysilane), butyl(di-tert-butoxysilane), tert-butyl-di-tert-butoxysilane, diphenyl(di-tert-butoxysilane), dimethyldiacetoxysilane, diethyldiacetoxysilane, dipropyldiacetoxysilane, diisopropyldiacetoxysilane, di-tert-butyl-diacetoxysilane, diphenyldiacetoxysilane, phenylmethyldiacetoxysilane, phenylethyldiacetoxysilane, phenylpropyldiacetoxysilane, phenylisopropyldiacetoxysilane, phenylbutyldiacetoxysilane, phenyl(tert-butyl)diacetoxysilane, diacetoxysilane, methyldiacetoxysilane, ethyldiacetoxysilane, propyldiacetoxysilane, isopropyldiacetoxysilane, butyldiacetoxysilane, tert-butyl-diacetoxysilane, diphenyldiacetoxysilane, dimethyldiphenoxysilane, diethyldiphenoxysilane, dipropyldiphenoxysilane, diisopropyldiphenoxysilane, dibutyldiphenoxysilane, di-tert-butyl-diphenoxysilane, diphenyldiphenoxysilane, phenylmethyldiphenoxysilane, phenylethyldiphenoxysilane, phenylisopropyldiphenoxysilane, phenylbutyldiphenoxysilane, phenyl-tert-butyl-diphenoxysilane, diphenoxysilane, methyldiphenoxysilane, ethyldiphenoxysilane, propyldiphenoxysilane, isopropyldiphenoxysilane, butyldiphenoxysilane, tert-butyldiphenoxysilane, and diphenyldiphenoxysilane. These compounds may be used alone or in combination of 2 or more.

The silicon compound expressed by the structural formula (7) is not particularly limited, and may be appropriately selected in accordance with the object. Specific examples thereof include trimethylmethoxysilane, triethylmethoxysilane, tripropylmethoxysilane, triisopropylmethoxysilane, tributylmethoxysilane, tri-tert-butylmethoxysilane, triphenylmethoxysilane, diphenylmethylmethoxysilane, diethylphenylmethoxysilane, diphenylethylmethoxysilane, dipropylphenylmethoxysilane, diphenylpropylmethoxysilane, diisopropylphenylmethoxysilane, diphenylisopropylmethoxysilane, dibutylphenylmethoxysilane, dibutylmethylmethoxysilane, di-tert-butylphenylmethoxysilane, diphenyl-tert-butylmethoxysilane, monomethoxysilane, methylmethoxysilane, ethylmethoxysilane, propylmethoxysilane, isopropylmethoxysilane, butylmethoxysilane, tert-butylmethoxysilane, phenylmethoxysilane, methylphenylmethoxysilane, ethylphenylmethoxysilane, propylphenylmethoxysilane, isopropylphenylmethoxysilane, butylphenylmethoxysilane, tert-butylphenylmethoxysilane, trimethylethoxysilane, triethylethoxysilane, tripropylethoxysilane, triisopropylethoxysilane, tributylethoxysilane, tri-tert-butylethoxysilane, triphenylethoxysilane, dimethylphenylethoxysilane, diphenylmethylethoxysilane, diethylphenylethoxysilane, diphenylethylethoxysilane, dipropylphenylethoxysilane, diphenylpropylethoxysilane, diisopropylphenylethoxysilane, diphenylisopropylethoxysilane, dibutylphenylethoxysilane, dibutylmethylethoxysilane, di-tert-butylphenylethoxysilane, diphenyl-tert-butylethoxysilane, monoethoxysilane, methylethoxysilane, ethylethoxysilane, propylethoxysilane, isopropylethoxysilane, butylethoxysilane, tert-butylethoxysilane, phenylethoxysilane, methylphenylethoxysilane, ethylphenylethoxysilane, propylphenylethoxysilane, isopropylphenylethoxysilane, butylphenylethoxysilane, tert-butylphenylethoxysilane, trimethylpropoxysilane, triethylpropoxysilane, tripropylpropoxysilane, triisopropylpropoxysilane, tributylpropoxysilane, tri-tert-butylpropoxysilane, triphenylpropoxysilane, dimethylphenylpropoxysilane, diphenylmethylpropoxysilane, diethylphenylpropoxysilane, diphenylethylpropoxysilane, dipropylphenylpropoxysilane, diphenylpropylpropoxysilane, diisopropylphenylpropoxysilane, diphenylisopropylpropoxysilane, dibutylphenylpropoxysilane, dibutylmethylpropoxysilane, di-tert-butylphenylpropoxysilane, diphenyl-tert-butylpropoxysilane, monopropoxysilane, methylpropoxysilane, propylpropoxysilane, isopropylpropoxysilane, butylpropoxysilane, tert-butylpropoxysilane, phenylpropoxysilane, methylphenylpropoxysilane, ethylphenylpropoxysilane, propylphenylethoxysilane, isopropylphenylpropoxysilane, butylphenylpropoxysilane, tert-butylphenylpropoxysilane, trimethylisopropoxysilane, triethylisopropoxysilane, tripropylisopropoxysilane, triisopropylisopropoxysilane, butyltriisopropoxysilane, tributylisopropoxysilane, tri-tert-butylisopropoxysilane, triphenylisopropoxysilane, dimethylphenylisopropoxysilane, diphenylmethylisopropoxysilane, diethylphenylisopropoxysilane, diphenylethylisopropoxysilane, dipropylphenylisopropoxysilane, diphenylpropylisopropoxysilane, diisopropylphenylisopropoxysilane, diphenylisopropylisopropoxysilane, dibutylphenylisopropoxysilane, dibutylmethylisopropoxysilane, di-tert-butylphenylisopropoxysilane, diphenyl-tert-butylisopropoxysilane, monoisopropoxysilane, methylisopropoxysilane, ethylisopropoxysilane, propylisopropoxysilane, isopropylisopropoxysilane, butylisopropoxysilane, tert-butylisopropoxysilane, phenylisopropoxysilane, methylphenylisopropoxysilane, ethylphenylisopropoxysilane, propylphenylethoxysilane, isopropylphenylisopropoxysilane, butylphenylisopropoxysilane, tert-butylphenylisopropoxysilane, trimethylbutoxysilane, triethylbutoxysilane, tripropylbutoxysilane, triisopropylbutoxysilane, tributylbutoxysilane, tri-tert-butylbutoxysilane, triphenylbutoxysilane, dimethylphenylbutoxysilane, diphenylmethylbutoxysilane, diethylphenylbutoxysilane, diphenylethylbutoxysilane, dipropylphenylbutoxysilane, diphenylpropylbutoxysilane, diisopropylphenylbutoxysilane, diphenylisopropylbutoxysilane, dibutylphenylbutoxysilane, dibutylmethylbutoxysilane, di-tert-butylphenylbutoxysilane, diphenyl-tert-butylbutoxysilane, monobutoxysilane, methylbutoxysilane, ethylbutoxysilane, propylbutoxysilane, isopropylbutoxysilane, butylbutoxysilane, tert-butylbutoxysilane, phenylbutoxysilane, methylphenylbutoxysilane, ethylphenylbutoxysilane, propylphenylethoxysilane, isopropylphenylbutoxysilane, butylphenylbutoxysilane, tert-butylphenylbutoxysilane, methyl-tri-tert-butoxysilane, dimethyl-di-tert-butoxysilane, trimethyl-tert-butoxysilane, triethyl-tert-butoxysilane, tripropyl-tert-butoxysilane, triisopropyl-tert-butoxysilane, tributyl-tert-butoxysilane, tritert-butyl-tert-butoxysilane, triphenyl-tert-butoxysilane, dimethylphenyl-tert-butoxysilane, diphenylmethyl-tert-butoxysilane, diethylphenyl-tert-butoxysilane, diphenylethyl-tert-butoxysilane, dipropylphenyl-tert-butoxysilane, diphenylpropyl-tert-butoxysilane, diisopropylphenyl-tert-butoxysilane, diphenylisopropyl-tert-butoxysilane, dibutylphenyl-tert-butoxysilane, dibutylmethyl-tert-butoxysilane, di-tert-butylphenyltertbutoxysilane, diphenyl-tert-butyl-tert-butoxysilane, mono-tert-butoxysilane, methyl-tert-butoxysilane, ethyl-tert-butoxysilane, propyl-tert-butoxysilane, isopropyl-tert-butoxysilane, butyl-tert-butoxysilane, tert-butyl-tert-butoxysilane, phenyl-tert-butoxysilane, methylphenyl-tert-butoxysilane, ethylphenyl-tert-butoxysilane, ropylphenylethoxysilane, isopropylphenyl-tert-butoxysilane, butylphenyl-tert-butoxysilane, tert-butylphenyl-tert-butoxysilane, trimethylacetoxysilane, triethylacetoxysilane, tripropylacetoxysilane, triisopropylacetoxysilane, dibutyldiacetoxysilane, tributylacetoxysilane, tri-tert-butylacetoxysilane, triphenylacetoxysilane, dimethylphenylacetoxysilane, diphenylmethylacetoxysilane, diethylphenylacetoxysilane, diphenylethylacetoxysilane, dipropylphenylacetoxysilane, diphenylpropylacetoxysilane, diisopropylphenylacetoxysilane, diphenylisopropylacetoxysilane, dibutylphenylacetoxysilane, dibutylmethylacetoxysilane, di-tert-butylphenylacetoxysilane, diphenyl-tert-butylacetoxysilane, monoacetoxysilane, methylacetoxysilane, ethylacetoxysilane, propylacetoxysilane, isopropylacetoxysilane, butylacetoxysilane, tert-butylacetoxysilane, phenylacetoxysilane, methylphenylacetoxysilane, ethylphenylacetoxysilane, propylphenylethoxysilane, isopropylphenylacetoxysilane, butylphenylacetoxysilane, tert-butylphenylacetoxysilane, trimethylphenoxysilane, triethylphenoxysilane, tripropylphenoxysilane, triisopropylphenoxysilane, tributylphenoxysilane, tri-tert-butylphenoxysilane, triphenylphenoxysilane, dimethylphenylphenoxysilane, diphenylmethylphenoxysilane, diethylphenylphenoxysilane, diphenylethylphenoxysilane, dipropylphenylphenoxysilane, diphenylpropylphenoxysilane, diisopropylphenylphenoxysilane, diphenylisopropylphenoxysilane, dibutylphenylphenoxysilane, dibutylmethylphenoxysilane, di-tert-butylphenylphenoxysilane, diphenyl-tert-butylphenoxysilane, monophenoxysilane, methylphenoxysilane, ethylphenoxysilane, propylphenoxysilane, isopropylphenoxysilane, butylphenoxysilane, tert-butylphenoxysilane, phenylphenoxysilane, methylphenylphenoxysilane, ethylphenylphenoxysilane, propylphenylethoxysilane, isopropylphenylphenoxysilane, butylphenylphenoxysilane, and tert-butylphenylphenoxysilane. These compounds may be used alone or in combination of 2 or more.

In addition, when n=0 in the general formulas (1) to (7), the combination of at least one of the silicon compounds expressed by the following structural formulas (8) to (10), and at least one of the silicon compounds expressed by the following structural formulas (11) to (14) may be suitably used.

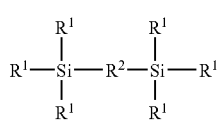

Structural formula (8)

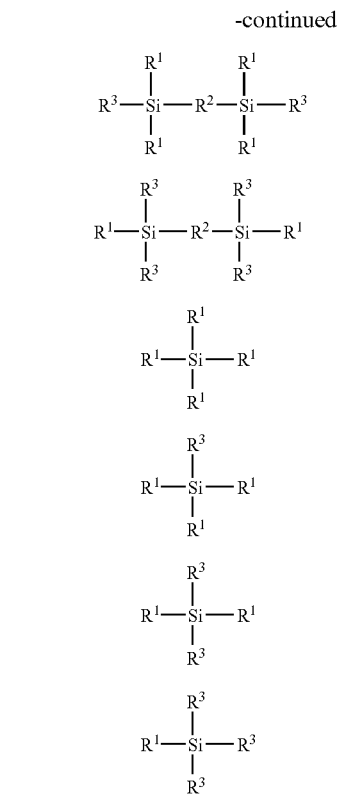

Here, in the structural formulas (8) to (14), $R^1$ may be the same as or different from each other, represents one selected from the group consisting of a chlorine atom, a bromine atom, a fluorine atom, and a hydrogen atom. $R^2$ represents one selected from the group consisting of a hydrocarbon with a carbon number of 1 to 4, an aromatic hydrocarbon, and a hydrogen atom. $R^3$ may be the same as or different from each other, and represents one selected from the group consisting of a hydrocarbon with a carbon number of 1 to 3 and an aromatic hydrocarbon.

The silicon compound expressed by the structural formula (8) is not particularly limited, and may be appropriately selected in accordance with the object. Specific examples thereof include:
bis(trichlorosilyl)methane,
1,2-bis(trichlorosilyl)ethane,
1,3-bis(trichlorosilyl)propane,
1,4-bis(trichlorosilyl)butane,
1,4-bis(trichlorosilyl)benzene,
bis(trifluorosilyl)methane,
1,2-bis(trifluorosilyl)ethane,
1,3-bis(trifluorosilyl)propane,
1,4-bis(trifluorosilyl)butane,
1,4-bis(trifluorosilyl)benzene,
bis (tribromosilyl) methane,
1,2-bis(tribromosilyl)ethane,
1,3-bis(tribromosilyl)propane,
1,4-bis(tribromosilyl)butane,
1,4-bis(tribromosilyl)benzene,
bis (trihydrosilyl) methane,
1,2-bis(trihydrosilyl)ethane,
1,3-bis(trihydrosilyl)propane,
1,4-bis(trihydrosilyl)butane,
1,4-bis(trihydrosilyl)benzene.

These compounds may be used alone or in combination of 2 or more.

The silicon compound expressed by the structural formula (9) is not particularly limited, and may be appropriately selected in accordance with the object. Specific examples thereof include:
bis(dichloromethylsilyl)methane,
1,2-bis(dichloromethylsilyl)ethane,
1,3-bis(dichloromethylsilyl)propane,
1,4-bis(dichloromethylsilyl)butane,
1,4-bis(dichloromethylsilyl)benzene,
bis(difluoromethylsilyl)methane,
1,2-bis(difluoromethylsilyl)ethane,
1,3-bis(difluoromethylsilyl)propane,
1,4-bis(difluoromethylsilyl)butane,
1,4-bis(difluoromethylsilyl)benzene,
bis (dibromomethylsilyl) methane,
1,2-bis(dibromomethylsilyl)ethane,
1,3-bis(dibromomethylsilyl)propane,
1,4-bis(dibromomethylsilyl)butane,
1,4-bis(dibromomethylsilyl)benzene,
bis(dihydromethylsilyl) methane,
1,2-bis(dihydromethylsilyl)ethane,
1,3-bis(dihydromethylsilyl)propane,
1,4-bis(dihydromethylsilyl)butane,
1,4-bis(dihydromethylsilyl)benzene,
bis(dichloroethylsilyl)methane,
1,2-bis(dichloroethylsilyl)ethane,
1,3-bis(dichloroethylsilyl)propane,
1,4-bis(dichloroethylsilyl)butane,
1,4-bis(dichloroethylsilyl)benzene,
bis(difluoroethylsilyl)methane,
1,2-bis(difluoroethylsilyl)ethane,
1,3-bis(difluoroethylsilyl)propane,
1,4-bis(difluoroethylsilyl)butane,
1,4-bis(difluoroethylsilyl)benzene,
bis (dibromoethylsilyl) methane,
1,2-bis(dibromoethylsilyl)ethane,
1,3-bis(dibromoethylsilyl)propane,
1,4-bis(dibromoethylsilyl)butane,
1,4-bis(dibromoethylsilyl)benzene,
bis(dihydroethylsilyl)methane,
1,2-bis(dihydroethylsilyl)ethane,
1,3-bis(dihydroethylsilyl)propanem,
1,4-bis(dihydroethylsilyl)butane,
1,4-bis(dihydroethylsilyl)benzene,
bis(dichloropropylsilyl)methane,
1,2-bis(dichloropropylsilyl)ethane,
1,3-bis(dichloropropylsilyl)propane,
1,4-bis(dichloropropylsilyl)butane,
1,4-bis(dichloropropylsilyl)benzene,
bis(difluoropropylsilyl)methane,
1,2-bis(difluoropropylsilyl)ethane,
1,3-bis(difluoropropylsilyl)propane,
1,4-bis(difluoropropylsilyl)butane,
1,4-bis(difluoropropylsilyl)benzene,
bis(dibromopropylsilyl)methane,
1,2-bis(dibromopropylsilyl)ethane,
1,3-bis(dibromopropylsilyl)propane,
1,4-bis(dibromopropylsilyl)butane,
1,4-bis(dibromopropylsilyl)benzene,
bis(dihydropropylsilyl) methane,
1,2-bis(dihydropropylsilyl)ethane,
1,3-bis(dihydropropylsilyl)propane,
1,4-bis(dihydropropylsilyl)butane,
1,4-bis(dihydropropylsilyl)benzene,
bis(dichloroisopropylsilyl) methane,
1,2-bis(dichloroisopropylsilyl)ethane,
1,3-bis(dichloroisopropylsilyl)propane,
1,4-bis(dichloroisopropylsilyl)butane,
1,4-bis(dichloroisopropylsilyl)benzene,
bis(difluoroisopropylsilyl)methane,
1,2-bis(difluoroisopropylsilyl)ethane,
1,3-bis(difluoroisopropylsilyl)propane,
1,4-bis(difluoroisopropylsilyl)butane,
1,4-bis(difluoroisopropylsilyl)benzene,
bis(dibromoisopropylsilyl)methane,
1,2-bis(dibromoisopropylsilyl)ethane,
1,3-bis(dibromoisopropylsilyl)propane,
1,4-bis(dibromoisopropylsilyl)butane,
1,4-bis(dibromoisopropylsilyl)benzene,
bis(dihydroisopropylsilyl)methane,
1,2-bis(dihydroisopropylsilyl)ethane,
1,3-bis(dihydroisopropylsilyl)propane,
1,4-bis(dihydroisopropylsilyl)butane,
1,4-bis(dihydroisopropylsilyl)benzene,
bis(dichlorobutylsilyl)methane,
1,2-bis(dichlorobutylsilyl)ethane,
1,3-bis(dichlorobutylsilyl)propane,
1,4-bis(dichlorobutylsilyl)butane,
1,4-bis(dichlorobutylsilyl)benzene,
bis(difluorobutylsilyl)methane,
1,2-bis(difluorobutylsilyl)ethane,
1,3-bis(difluorobutylsilyl)propane,
1,4-bis(difluorobutylsilyl)butane,
1,4-bis(difluorobutylsilyl)benzene,
bis(dibromobutylsilyl)methane,
1,2-bis(dibromobutylsilyl)ethane,
1,3-bis(dibromobutylsilyl)propane,
1,4-bis(dibromobutylsilyl)butane,
1,4-bis(dibromobutylsilyl)benzene,
bis(dihydrobutylsilyl)methane,
1,2-bis(dihydrobutylsilyl)ethane,
1,3-bis(dihydrobutylsilyl)propane,
1,4-bis(dihydrobutylsilyl)butane,
1,4-bis(dihydrobutylsilyl)benzene,
bis (dichloro-tert-butylsilyl) methane,
1,2-bis(dichloro-tert-butylsilyl)ethane,
1,3-bis(dichloro-tert-butylsilyl)propane,
1,4-bis(dichloro-tert-butylsilyl)butane,
1,4-bis(dichloro-tert-butylsilyl)benzene,
bis(difluoro-tert-butylsilyl)methane,
1,2-bis(difluoro-tert-butylsilyl)ethane,
1,3-bis(difluoro-tert-butylsilyl)propane,
1,4-bis(difluoro-tert-butylsilyl)butane,
1,4-bis(difluoro-tert-butylsilyl)benzene,
bis(dibromo-tert-butylsilyl) methane,
1,2-bis(dibromo-tert-butylsilyl)ethane,
1,3-bis(dibromo-tert-butylsilyl)propane,
1,4-bis(dibromo-tert-butylsilyl)butane,
1,4-bis(dibromo-tert-butylsilyl)benzene,
bis(dihydro-tert-butylsilyl)methane,
1,2-bis(dihydro-tert-butylsilyl)ethane,
1,3-bis(dihydro-tert-butylsilyl)propane,
1,4-bis(dihydro-tert-butylsilyl)butane,
1,4-bis(dihydro-tert-butylsilyl)benzene,
bis(dichlorophenylsilyl)methane,
1,2-bis(dichlorophenylsilyl)ethane,
1,3-bis(dichlorophenylsilyl)propane,
1,4-bis(dichlorophenylsilyl)butane,
1,4-bis(dichlorophenylsilyl)benzene,
bis(difluorophenylsilyl)methane,
1,2-bis(difluorophenylsilyl)ethane,
1,3-bis(difluorophenylsilyl)propane, 1,4-bis(difluorophenylsilyl)butane,
1,4-bis(difluorophenylsilyl)benzene,
bis(dibromophenylsilyl)methane,
1,2-bis(dibromophenylsilyl)ethane,
1,3-bis(dibromophenylsilyl)propane,
1,4-bis(dibromophenylsilyl)butane,
1,4-bis(dibromophenylsilyl)benzene,
bis(dihydrophenylsilyl) methane,
1,2-bis(dihydrophenylsilyl)ethane,
1,3-bis(dihydrophenylsilyl)propane,
1,4-bis(dihydrophenylsilyl)butane, and
1,4-bis(dihydrophenylsilyl)benzene.

These compounds may be used alone or in combination of 2 or more.

The silicon compound expressed by the structural formula (10) is not particularly limited, and may be appropriately selected in accordance with the object. Specific examples thereof include:
bis(dimethylchlorosilyl)methane,
1,2-bis(dimethylchlorosilyl)ethane,
1,3-bis(dimethylchlorosilyl)propane,
1,4-bis(dimethylchlorosilyl)butane,
1,4-bis(dimethylchlorosilyl)benzene,
bis(dimethylfluorosilyl)methane,
1,2-bis(dimethylfluorosilyl)ethane,
1,3-bis(dimethylfluorosilyl) propane,
1,4-bis(dimethylfluorosilyl)butane,
1,4-bis(dimethylfluorosilyl)benzene,
bis(dimethylbromosilyl)methane,
1,2-bis(dimethylbromosilyl)ethane,
1,3-bis(dimethylbromosilyl)propane,
1,4-bis(dimethylbromosilyl)butane,
1,4-bis(dimethylbromosilyl)benzene,
bis (dimethylhydrosilyl) methane,
1,2-bis(dimethylhydrosilyl)ethane,
1,3-bis(dimethylhydrosilyl)propane,
1,4-bis(dimethylhydrosilyl)butane,
1,4-bis(dimethylhydrosilyl)benzene,
bis(diethylchlorosilyl)methane,
1,2-bis(diethylchlorosilyl)ethane,
1,3-bis(diethylchlorosilyl)propane,
1,4-bis(diethylchlorosilyl)butane,
1,4-bis(diethylchlorosilyl)benzene,
bis (diethyfluorosilyl) methane,
1,2-bis(diethylfluorosilyl)ethane,
1,3-bis(diethylfluorosilyl)propane,
1,4-bis(diethylfluorosilyl)butane,
1,4-bis(diethylfluorosilyl)benzene,
bis (diethylbromosilyl) methane,
1,2-bis(diethylbromosilyl)ethane,
1,3-bis(diethylbromosilyl)propane,
1,4-bis(diethylbromosilyl)butane,
1,4-bis(diethylbromosilyl)benzene,
bis(diethylhydrosilyl)methane,
1,2-bis(diethylhydrosilyl)ethane,
1,3-bis(diethylhydrosilyl)propane,
1,4-bis(diethylhydrosilyl)butane,
1,4-bis(diethylhydrosilyl)benzene,
bis(dipropylchlorosilyl)methane,
1,2-bis(dipropylchlorosilyl)ethane,
1,3-bis(dipropylchlorosilyl)propane,
1,4-bis(dipropylchlorosilyl)butane,
1,4-bis(dipropylchlorosilyl)benzene,
bis(dipropylfluorosilyl)methane,
1,2-bis(dipropylfluorosilyl)ethane,
1,3-bis(dipropylfluorosilyl)propane,
1,4-bis(dipropyffluorosilyl)butane,
1,4-bis(dipropyfluorosilyl)benzene,
bis(dipropylbromosilyl) methane,
1,2-bis(dipropylbromosilyl)ethane,
1,3-bis(dipropylbromosilyl)propane,
1,4-bis(dipropylbromosilyl)butane,
1,4-bis(dipropylbromosilyl)benzene,
bis (dipropylhydrosilyl) methane,
1,2-bis(dipropylhydrosilyl)ethane,
1,3-bis(dipropylhydrosilyl)propane,
1,4-bis(dipropylhydrosilyl)butane,
1,4-bis(dipropylhydrosilyl)benzene,
bis(diisopropylchlorosilyl) methane,
1,2-bis(diisopropylchlorosilyl)ethane,
1,3-bis(diisopropylchlorosilyl)propane,
1,4-bis(diisopropylchlorosilyl)butane,
1,4-bis(diisopropylchlorosilyl)benzene,
bis(diisopropylfluorosilyl)methane,
1,2-bis(diisopropylfluorosilyl)ethane,
1,3-bis(diisopropylfluorosilyl)propane,
1,4-bis(diisopropylfluorosilyl)butane,
1,4-bis(diisopropylfluorosilyl)benzene,
bis(diisopropylbromosilyl) methane,
1,2-bis(diisopropylbromosilyl)ethane,
1,3-bis(diisopropylbromosilyl)propane,
1,4-bis(diisopropylbromosilyl)butane,
1,4-bis(diisopropylbromosilyl)benzene,
bis (diisopropylhydrosilyl)methane,
1,2-bis(diisopropylhydrosilyl)ethane,
1,3-bis(diisopropylhydrosilyl)propane,
1,4-bis(diisopropylhydrosilyl)butane,
1,4-bis(diisopropylhydrosilyl)benzene,
bis(dibutylchlorosilyl)methane,
1,2-bis(dibutylchlorosilyl)ethane,
1,3-bis(dibutylchlorosilyl)propane,
1,4-bis(dibutylchlorosilyl)butane,
1,4-bis(dibutylchlorosilyl)benzene,
bis(dibutylfluorosilyl)methane,
1,2-bis(dibutylfluorosilyl)ethane,
1,3-bis(dibutylfluorosilyl)propane,
1,4-bis(dibutylfluorosilyl)butane,
1,4-bis(dibutylfluorosilyl)benzene,
bis(dibutylbromosilyl)methane,
1,2-bis(dibutylbromosilyl)ethane,
1,3-bis(dibutylbromosilyl)propane,
1,4-bis(dibutylbromosilyl)butane,
1,4-bis(dibutylbromosilyl)benzene,
bis(dibutylhydrosilyl) methane,
1,2-bis(dibutylhydrosilyl)ethane,
1,3-bis(dibutylhydrosilyl)propane,
1,4-bis(dibutylhydrosilyl)butane,
1,4-bis(dibutylhydrosilyl)benzene,
bis(di-tert-butylchlorosilyl) methane,
1,2-bis(di-tert-butylchlorosilyl)ethane,
1,3-bis(di-tert-butylchlorosilyl)propane,
1,4-bis(di-tert-butylchlorosilyl)butane,
1,4-bis(di-tert-butylchlorosilyl)benzene,
bis(di-tert-butylfluorosilyl)methane,
1,2-bis(di-tert-butylfluorosilyl)ethane,
1,3-bis(di-tert-butyfluorosilyl)propane,
1,4-bis(di-tert-butylfluorosilyl)butane,
1,4-bis(di-tert-butylfluorosilyl)benzene,
bis(di-tert-butylbromosilyl) methane,
1,2-bis(di-tert-butylbromosilyl)ethane,
1,3-bis(di-tert-butylbromosilyl)propane,
1,4-bis(di-tert-butylbromosilyl)butane,
1,4-bis(di-tert-butylbromosilyl)benzene,
bis(di-tert-butylhydrosilyl) methane, 1,2-bis(di-tert-butylhydrosilyl)ethane,
1,3-bis(di-tert-butylhydrosilyl)propane,
1,4-bis(di-tert-butylhydrosilyl)butane,
1,4-bis(di-tert-butylhydrosilyl)benzene,
bis(diphenylchlorosilyl) methane,
1,2-bis(diphenylchlorosilyl)ethane,
1,3-bis(diphenylchlorosilyl)propane,
1,4-bis(diphenylchlorosilyl)butane,
1,4-bis(diphenylchlorosilyl)benzene,
bis(diphenylfluorosilyl)methane,
1,2-bis(diphenylfluorosilyl)ethane,
1,3-bis(diphenylfluorosilyl)propane,
1,4-bis(diphenylfluorosilyl)butane,
1,4-bis(diphenylfluorosilyl)benzene,
bis(diphenylbromosilyl)methane,
1,2-bis(diphenylbromosilyl)ethane,
1,3-bis(diphenylbromosilyl)propane,
1,4-bis(diphenylbromosilyl)butane,
1,4-bis(diphenylbromosilyl)benzene,
bis(diphenylhydrosilyl)methane,
1,2-bis(diphenylhydrosilyl)ethane,
1,3-bis(diphenylhydrosilyl)propane,
1,4-bis(diphenylhydrosilyl)butane, and
1,4-bis(diphenylhydrosilyl)benzene.

These compounds may be used alone or in combination of 2 or more.

The silicon compound expressed by the structural formula (11) is not particularly limited, and may be appropriately selected in accordance with the object. Specific examples thereof include tetrachlorosilane, tetrafluorosilane, and tetrabromosilane. These compounds may be used alone or in combination of 2 or more.

The silicon compound expressed by the structural formula (12) is not particularly limited, and may be appropriately selected in accordance with the object. Specific examples thereof include methyltrichlorosilane, ethyltrichlorosilane, propyltrichlorosilane, isopropyltrichlorosilane, butyltrichlorosilane, tert-butyltrichlorosilane, phenyltrichlorosilane, trichlorosilane, methyltrifluorosilane, ethyltrifluorosilane, triethylfluorosilane, propyltrifluorosilane, isopropyltrifluorosilane, butyltrifluorosilane, tert-butyltrifluorosilane, phenyltrifluorosilane, trifluorosilane, methyltribromosilane, ethyltribromosilane, propyltribromosilane, isopropyltribromosilane, butyltribromosilane, tert-butyltribromosilane, phenyltribromosilane, tribromosilane, and dibromosilane. These compounds may be used alone or in combination of 2 or more.

The silicon compound expressed by the structural formula (13) is not particularly limited, and may be appropriately selected in accordance with the object. Specific examples include dimethyldichlorosilane, diethyldichlorosilane, dipropyldichlorosilane, diisopropyldichlorosilane, dibutyldichlorosilane, di-tert-butyl-dichlorosilane, diphenyldichlorosilane, dimethylphenylchlorosilane, phenylethyldichlorosilane, phenylpropyldichlorosilane, phenylisopropyldichlorosilane, phenylbutyldichlorosilane, phenyl-tert-butyl-dichlorosilane, phenylmethyldichlorosilane, dichlorosilane, methyldichlorosilane, ethyldichlorosilane, propyldichlorosilane, isopropyldichlorosilane, butyldichlorosilane, tert-butyl-dichlorosilane, diphenyldichlorosilane, dimethyldifluorosilane, diethyldifluorosilane, dipropyldifluorosilane, diisopropyldifluorosilane, dibutyldifluorosilane, di-tert-butyldifluorosilane, diphenyldifluorosilane, phenylmethyldifluorosilane, phenylethyldifluorosilane, phenylpropyldifluorosilane, phenylisopropyldifluorosilane, phenylbutyldifluorosilane, phenyl-tert-butyl-difluorosilane, di-fluorosilane, methyldifluorosilane, ethyldifluorosilane, propyldifluorosilane, isopropyldifluorosilane, butyldifluorosilane, tert-butyl-difluorosilane, diphenyldifluorosilane, dimethyldibromosilane, diethyldibromosilane, dipropyldibromosilane, diisopropyldibromosilane, dibutyldibromosilane, di-tert-butyl-dibromosilane, diphenyldibromosilane, phenylmethyldibromosilane, phenylethyldibromosilane, phenylpropyldibromosilane, phenylisopropyldibromosilane, phenylbutyldibromosilane, phenyl-tert-butyl-dibromosilane, methyldibromosilane, ethyldibromosilane, propyldibromosilane, isopropyldibromosilane, butyldibromosilane, tert-butyl-dibromosilane, and diphenyldibromosilane. These compounds may be used alone or in combination of 2 or more.

The silicon compound expressed by the structural formula (14) is not particularly limited, and may be appropriately selected in accordance with the object. Specific examples thereof include trimethylchlorosilane, triethylchlorosilane, tripropylchlorosilane, triisopropylchlorosilane, tributylchlorosilane, tri-tert-butyl-chlorosilane, triphenylchlorosilane, diphenylmethylchlorosilane, diethylphenylchlorosilane, diphenylethylchlorosilane, dipropylphenylchlorosilane, diphenylpropylchlorosilane, diisopropylphenylchlorosilane, diphenylisopropylchlorosilane, dibutylphenylchlorosilane, dibutylmethylchlorosilane, di-tert-butyl-phenylchlorosilane, diphenyl-tert-butyl-chlorosilane, monochlorosilane, methylchlorosilane, ethylchlorosilane, propylchlorosilane, isopropylchlorosilane, butylchlorosilane, tert-butyl-chlorosilane, phenylchlorosilane, methylphenylchlorosilane, isopropylphenylchlorosilane, butylphenylchlorosilane, tert-butyl-phenylchlorosilane, trimethylfluorosilane, tripropylfluorosilane, triisopropylfluorosilane, tributylfluorosilane, tri-tert-butyl-fluorosilane, triphenylfluorosilane, dimethylphenylfluorosilane, diphenylmethylfluorosilane, diethylphenylfluorosilane, diphenylethylfluorosilane, dipropylphenylfluorosilane, diphenylpropylfluorosilane, diisopropylphenylfluorosilane, diphenylisopropylfluorosilane, dibutylphenylfluorosilane, dibutylmethylfluorosilane, di-tert-butyl-phenylfluorosilane, diphenyl-tert-butyl-fluorosilane, monofluorosilane, methylfluorosilane, ethylfluorosilane, propylfluorosilane, isopropylfluorosilane, tert-butyl-fluorosilane, butyffluorosilane, phenylfluorosilane, methylphenylfluorosilane, ethylphenylethoxysilane, propylphenylethoxysilane, isopropylphenylfluorosilane, butylphenylfluorosilane, tert-butyl-phenylfluorosilane, trimethylbromosilane, triethylbromosilane, tripropylbromosilane, triisopropylbromosilane, tributylbromosilane, tri-tert-butyl-bromosilane, triphenylbromosilane, dimethylphenylbromosilane, diphenylmethylbromosilane, diethylphenylbromosilane, diphenylethylbromosilane, dipropylphenylbromosilane, diphenylpropylbromosilane, diisopropylphenylbromosilane, diphenylisopropylbromosilane, dibutylphenylbromosilane, dibutylmethylbromosilane, di-tert-butyl-phenylbromosilane, diphenyl-tert-butyl-bromosilane, monobromosilane, methylbromosilane, ethylbromosilane, propylbromosilane, isopropylbromosilane, butylbromosilane, tert-butyl-bromosilane, phenylbromosilane, methylphenylbromosilane, ethylphenylethoxysilane, propylphenylethoxysilane, isopropylphenylbromosilane, butylphenylbromosilane, and tert-butyl-phenylbromosilane. These compounds may be used alone or in combination of 2 or more.

As the method of synthesizing the silicone polymer, there is no particular limitation to the reaction conditions or the like, and the method may be appropriately selected in accordance with the object, as long as a hydrolysis condensation polymerization reaction of at least one of silicon compounds expressed by the general formulas (1) to (3), and at least one of the silicon compounds expressed by the general formulas (4) to (7). Preferably, an alkali or acidic aqueous solution is used as a catalyzer.

The pH of the acidic and alkali acqueous solution is not particularly limited, and may be appropriately selected in accordance with the object. Preferably, the pH of the solution is 1 to 11.

If the pH of the solution exceeds 11, there may be a breakdown of a siloxane bond.

The acidic or alkali aqueous solution is not particularly limited, and may be appropriately selected in accordance with the object. Examples thereof include hydrochloric acid, nitric acid, sulfuric acid, toulene sulfonic acid, oxalic acid, maleic acid, formic acid, acetic acid, ammonia, tetramethylammonium hydroxide, tetraethylammonium hydroxide, tetrapropylammonium hydroxide, and tetrabutylammonium hydroxide. As the acidic aqueous solution, it is preferable not to use a hydrofluoric because there may be a breakdown of a siloxane bond.

In the hydrolysis condensation polymerization reaction, the copolymerization ratio of the silicon compounds is not particularly limited, and may be appropriately selected in accordance with the intended use of the silica film. For example, in the case of using a silica film as a protective film at the time of chemical mechanical polishing (CMP), since there is the requirement of chemical resistance and adhesiveness to an underlying layer in addition to the mechanical strength, it is preferable to use, in the copolymerization ratio of 1:5, the combination of at least one of the silicon compounds expressed by the general formulas (1) to (3), which contain hydrocarbon or aromatic hydrocarbon in its skeleton and provide the silocone polymer with the chemical resistance and the moisture resistance, and at least one of the silicon compounds expressed by the general formulas (4) to (7), which provide the silicone polymer with the mechanical strength and the adhesion property. More preferably, the combination of the silicon compounds expressed by the structural formulas (8) and (11) may be used in the copolymerization ratio of 1:2, which can provide the silicone polymer with a more improved mechanical strength and adhesion property.

In addition, in the case where the silica film is used as a hard mask during a dry etching in the manufacturing process of a multiplelayer wiring structure, or as an intermediate layer of a multilayer resist, it is preferable to adjust an etching selectivity by appropriately changing the amount of the silicon compounds expressed by the general formulas (4) to (7) relative to the silicon compounds expressed by the general formulas (1) to (3) which contain a hydrocarbon or an aromatic hydrocarbon in its skeleton and provide the silicone polymer with the etching resistance property.

Moreover, in the case of using the silica film as an intermediate layer of a multilayer resist, with the object of preventing the reflection of light, is is desirable to use the silicon compounds having an aromatic hydrocarbon in its skeleton. Alternatively, it is preferable to introduce an aromatic hydrocarbon to the side chain of a siloxane bond in the silicone polymer.

The hydrolysis conreaction condition of the hydrolysis condensation polymerization reaction is not particularly limited, and may be appropriately selected in accordance with the object. The reaction temperature is desirably 30° C. to 80° C., and more desirably 35° C. to 60° C. The agitation time is desirably 1 to 72 hours, and more desirably 10 to 48 hours.

—Organic Solvent—

In case of forming a silica film using the silica film forming material, it is preferable to form the silica film by means of a coating in terms of ease of film formation, and the silica film forming material desirably includes an organic solvent.

The organic solvent is not particularly limited as long as the silicone polymer is soluble therein, and may be appropriately selected in accordance with the object. Examples thereof include alcohols such as methylalcohol, ethylalcohol, propylalcohol, isopropylalcohol, butylalcohol, isobutylalcohol, and tert-butylalcohol; phenols such as phenol, cresol, diethyiphenol, triethyiphenol, propyiphenol, phenylphenol, vinylphenol, allylphenol, and nonylphenol; ketones such as cyclohexanone, methylisobutylketone, and methylethylketone; celosolves such as methylcelosolve, and ethylcelosolve; hydrocarbons such as hexane, octane, decane; and glycols such as propyleneglycol, propyleneglycolmonomethylether, and propyleneglycolmonomethyletheracetate. These are used alone or in combination of 2 or more.

—Other Components—

Other components is not particularly limited as long as it does not infringe the effects of the present invention, and may be appropriately selected corresponding to the object. For example, various known additives may be provided.

The conten of other components in the silica film forming material may be appropriately selected corresponding to types and contents of the silicon compounds expressed by the general formulas (1) to (7), the organic solvents and the like.

The silica film forming material according to the present invention comprises a silicone polymer that comprises, as part of its structure, CHx, an Si—O—Si bond, an Si—CH$_3$ bond, and an Si—CHx- bond, where the x indicates an integer of 0 to 2, and the silicone polymer is obtained by the hydrolysis condensation polymerization reaction of at least one the silicon compounds expressed by the general formulas from (1) to (3) having superior etching resistance and chemical resistance, and at least one of the silicon compounds expressed by the general formulas (4) to (7) having superior adhesion property. Thus, the silicone polymer excels in all properties of etching resistance, chemical resistance, moisture resistance, and adhesion property, making it possible to form a silica film with a low dielectric constant, which is suitable for use in the method of manufacturing the silica film of the present invention, the multilayer wiring structure of the present invention, and the semiconductor device of the present invention, described below.

(Silica Film and the Method of Manufacturing the Same)

The silica film according to the present invention is obtained by the method of manufacturing the silica film according to the present invention.

The method of manufacturing the silica film of the present invention comprises: coating the silica film material of the present invention onto the surface to be processed; and heating the surface to be processed, and further includes any other processes if needed.

Hereafter, the details of the silica film of the present invention will be made clear through the explanation of the method of manufacturing the silica film of the present invention.

<Coating Process>

In the coating process, the silica film forming material of the present invention is coated onto the surface to be processed.

The detail of the silica film forming material is given as described above.

The coating method is not particularly limited, and may be appropriately selected in accordance with the object. For instance, a spin coating method, a dip coating method, a kneader coating method, a curtain coating method, a blade coating method, and the like can be given as examples. Among these examples, a spin coating and a dip coating are preferred when considering coating efficiency and the like. In case of a spin coating method, as an example of the coating conditions, a rotation speed is 100 rpm to 10,000 rpm, preferably, 800 rpm to 5,000 rpm, and a coating time is 1 second to 10 minutes, preferably 10 seconds to 90 seconds.

The surface to be processed is not particularly limited, and may be appropriately selected in accordance with the object. In the case of forming the silica film in a semiconductor device, the surface to be processed may be a semiconductor substrate. Specific examples of the semiconductor substrate include a substate such as a silicon wafer, various oxide films, and low dielectric constant films such as porous silica film and the like.

Through the above process, the silica film forming material of the present invention is coated onto the surface to be processed.

<Heating Process>

In the heating process, the silica film forming material coated onto the surface to be processed is heated.

The heating method is not particularly limited, and may be appropriately selected in accordance with the object. Preferably, the organic solvent is dried and the silica film forming material is baked.

In this case, the oxidation of a hydrocarbon, aromatic hydrocarbon, and others, which has introduced to the side chain and skeleton of the silicone polymer, can be suppressed.

Conditions such as temperature, atmosphere, and so forth may be appropriately selected in accordance with the object. Preferably, the temperature is 50° C. to 400° C., more preferably, 80° C. to 350° C.

When the temperature is 50° C. or less, sufficient strength may not be obtained because the organic solvent remains in the film, and when the temperature exceeds 400° C., there may be a breakdown of the silicon-hydrocarbon bond of the side chain and skeleton in the silicone polymer.

With regard to the atmosphere, if the heating is performed in the air, there is a fear of raising the dielectric constant due to taking in oxygen from the air. Therefore, the heating may be preferably performed in the presence of an iner gas or under a reduced pressure. Preferable example of the inert gas includes a nitrogen gas.

Furthermore, in the case where the underlying layer of the silica film is a porous silica film formed by, for instance, a spin coating method, the heating process may be performed at one time after coating a material of forming the porous silica film, drying a solvent, and coating the silica film forming material on the porous silica film. In this case, a reduction in the cost to form the film can be devised.

<Other Processes>

Other processes are not particularly limited, and may be appropriately selected in accordance with the object. Examples thereof include a pattern forming process.

The pattern forming process is for forming a pattern by selectively exposing and developing the silica film formed by the coating process and heating process described above.

The pattern forming process can be performed according to well-known pattern forming methods.

In addition, baking treatment may be performed between the exposing and developing in terms of accelerating the reaction.

Next, the method of manufacturing the silica film of the present invention will be described in detail. For example, in the coating process, the silica film is formed by, first, coating the silica film forming material of the present invention onto the surface to be processed (for example, a low dielectric constant film such as porous silica film or the like) by a spin coating, and by heating at a temperature of 50 to 400° C. to dry the solvent, followed by baking. Consequently, the silica film of the present invention is formed. In addition, if exposing and developing the formed silica film according to the above pattern forming process, a pattern of the silica film having a desired form is formed.

The method of manufacturing the silica film of the present invention can be used suitably in various fields. Particularly, it can be preferably used in the manufacturing of the silica film of the present invention described below.

The silica film of the present invention is not particularly limited in the various characteristics of materials such as shape, structure, size, and so forth as long as the silica film includes the silicone polymer described above, and may be appropriately selected in accordance with the object. Preferably, the silica film has the following thickness, dielectric constant, etching resistance, chemical resistance, moisture resistance, adhesive strength, and so forth, which have the ability for use in a multilayer wiring structure and a semiconductor device.

The verification method of the existence of the silicone polymer is not particularly limited, and may be appropriately selected in accordance with the object. For example, an infrared spectroscopic analysis can be used. The existence of the silicone polymer can be verified by, for example, measuring the absorption peaks of CHx, Si—O—Si bond, Si—CH$_3$ bond, and Si—CHx- bond, and by analyzing to confirm that all of these structures are contained.

The form of the silica film is not particularly limited, and may be appropriately selected in accordance with the object. Examples of the form of the silica film include a solid film form, which is formed on the entire surface of the surface to be processed, and a patterned form.

Example of a method of forming the silica film having the solid film form include a method in which a base material having the surface to be processed is immersed into the silica film forming material of the present invention to form the entire surface of the base material surface (the surface to be processed).

Examples of a method of forming the silica film having the patterned form include:

a method in which the surface to be processed is patterned to have, for example, a line form, by using a resist, and the silica film forming material is coated therein; and a method in which a silica film of a solid film form is formed on the surface to be processed, a resist is coated and patterned to have a desired resist pattern, and then the a wet or dry etching is performed.

The structure of the silica film is not particularly limited, and may be appropriately selected in accordance with the object. For example, it may be a monolayer structure or a multilayer structure.

When the silica film has a patterned form or a multilayer structure, the dielectric constant in each portion of the patterned form or in each layer of the multilayer structure may be the same, or may be respectively different.

The size of the silica film is not particularly limited, and may be appropriately selected in accordance with the object. For example, when the silica film is used in the multilayer wiring structure, a semiconductor device, or the like, the size is preferred to correspond to the size of the existing semiconductor devices.

The thickness of the silica film is not particularly limited, and may be appropriately selected in accordance with the object. For example, when the silica film is used in multilayer wiring structure, a semiconductor device, and so forth, the thickness is normally 10 nm to 1 µm, preferably, 10 nm to 500 nm, more preferably, 10 nm to 300 nm from the perspective of its structure.

When the thickness is less than 10 nm, a structural defect such as pinholes may be created, and when the thickness exceeds 500 nm, the etching selectivity relative to the resist pattern may not be sufficiently obtained upon a dry etching.

The dielectric constant is not particularly limited, and may be appropriately selected in accordance with the object. It is preferably 3.0 or less, more preferably, 2.8 or less.

In addition, the dielectric constant can be measured by, for example, using a dielectric measuring device by forming gold electrodes on the silica film.

The etching resistance property can be evaluated by the etching rate. The etching rate is not particularly limited, and may be appropriately selected in accordance with the object. However, the etching rate changes depending on gas types, pressure, voltage, and so forth. For example, when $CF_4/CHF_3$ gas is used as the etching gas, the ratio of the etching rate of the silica film to the etching rate of the low dielectric constant film (for example, the porous silica film) is preferred to be from 1:1.5 to 1:10.0.

In addition, the etching rate can be measured as followed. Specifically, a sample is etched for a predetermined time by using a well-known etching device, and then the decreased film amount of the sample is measured to calculate the decreased amount per unit time.

The chemical resistance of the silica film is not particularly limited, and may be appropriately selected in accordance with the object. Preferably, the etching rate at the time of immersing in the 0.5 mass % HF is 1 nm/min to 100 nm/min.

The moisture resistance of the silica film is not particularly limited, and may be appropriately selected in accordance with the object. For example, in the case where the silica film is left to stand for one week at a room temperature, and a capacity of the silica film is measured by using a probe which is connected to an AC power of 1 MHz, 1 V, the change in the dielectric constant, which is calculated based on the measured capacity and the film thickness of the silica film, is preferably 0.3 or less, more preferably 0.2 or less.

The adhesive strength of the silica film is not particularly limited, and may be appropriately selected in accordance with the object. For example, the strength measured by, for example the adhesive strength measuring device ("Sebastian Five" manufactured by Quad Group) is preferred to be larger than 5.88 GPa (600 kgf/mm$^2$).

The silica film of the present invention, because of a low dielectric constant, can be used favorably as an insulation layer, and also can be used as a general low dielectric constant film (interlayer insulation film) itself, or used as a protective to be formed on the surface of the low dielectric constant film. Especially, the silica film of the present invention has the ability to be used as the protective film because it is superior in the etching resistance, chemical resistance, moisture resistance, as well as the adhesive property. For this reason, the silica film of the present invention can be used favorably as a hard mask during a dry etching in the method of manufacturing a multilayer wiring structure of the present invention and the method of manufacturing a semiconductor device of the present invention described later, and in this case, a fine wiring pattern can be formed with high precision.

The silica film having excellent chemical resistance can be suitably used as a protective film during a chemical mechanical polishing (CMP). In such a case, those portions other than those portions not to be polished are protected thereby enabling highly precise polishing.

The silica film of the present invention excels in etching resistance, chemical resistance, and moisture resistance, and the adhesive property are favorable. Moreover, it has the low dielectric constant and can contribute to a higher response speed, and therefore, this is suitable to the semiconductor device such as a multilayer wiring structure, a semiconductor integrated circuit, and so forth that require higher response speeds, and is especially suitable to the following multilayer wiring structure of the present invention and the semiconductor device of the present invention.

(Multilayer Wiring Structure and Method of Manufacturing the Same)

The multilayer wiring structure of the present invention includes at least the silica film of the present invention.

The method of manufacturing a multilayer wiring structure of the present invention is a method for manufacturing the multilayer wiring structure of the present invention described above. The method of manufacturing a multilayer wiring structure includes at least a silica film forming process and a wiring structure forming process, and further includes other processes which are selected suitably according to necessity.

Hereinafter, the details of the multilayer wiring structure of the present invention will be made clear through the description of the method of manufacturing the multilayer wiring structure of the present invention.

<Silica Film Forming Process>

In the silica film forming process, the silica film forming material of the present invention is coated onto the surface to be processed and then heated the surface to be processed so as to form the silica film.

The silica film forming process can be performed favorably by the method of manufacturing the silica film of the present invention.

In addition, the details regarding the surface to be processed, the coating, and others are as stated above.

The heating method is not particularly limited, and may be appropriately selected in accordance with the object. Preferably, the organic solvent is dried and the silica film forming material is baked. In this case, the oxidation of a hydrocarbon, aromatic hydrocarbon, and others, which has introduced to the side chain and skeleton of the silicone polymer, can be suppressed.

Conditions such as temperature, atmosphere, and so forth may be appropriately selected in accordance with the object. Preferably, the temperature is 50° C. to 400° C., more preferably, 80° C. to 350° C.

When the temperature is 50° C. or less, sufficient strength may not be obtained because the organic solvent remains in the film, and when the temperature exceeds 400° C., there may be a breakdown of the silicon-hydrocarbon bond of the side chain and skeleton in the silicone polymer.

With regard to the atmosphere, if the heating is performed in the air, there is a fear of raising the dielectric constant due to taking in oxygen from the air. Therefore, the heating may be preferably performed in the presence of an inner gas or under a reduced pressure. Preferable example of the inert gas includes a nitrogen gas.

Furthermore, in the case where the underlying layer of the silica film is a film (for example, a low dielectric constant film such as a porous silica film) formed by, for instance, a spin coating method, the heating process may be performed at one time after coating a material of forming the low dielectric constant film, drying a solvent, and coating the silica film forming material on the low dielectric constant film. In this case, a reduction in the cost to form the film can be devised.

<Wiring Structure Forming Process>

In the wiring forming process, a wiring structure is formed.

When the multilayer wiring structure is formed, the wiring structure forming process is preferred to include other processes which are appropriately selected such as the through-via forming process and the conductor plating process.

—Through-Via Forming Process—

In the through-via forming process, a through-via is formed in order to connect to the wiring formed at the uppermost layer of the silica film that is formed on the surface to be processed.

Forming the through-via is performed by irradiating the laser beam with the appropriate exposure amount on the portion of the through-via.

The laser bean is not particularly limited and may be appropriately selected in accordance with the object, and for example, a carbon dioxide gas laser, an eximer laser, a YAG laser, or the like can be given.

—Conductor Plating Process—

In the conductor plating process, a conductor plating layer is formed by coating a conductor as the wiring precursor on the entire surface of the silica film formed on the surface to be processed.

The conductor plating can be performed by using an ordinary plating method such as, for example, non-electrolytic plating, electrolytic plating or the like.

Formation of the wiring structure is accomplished by etching the conductor plating layer formed by the conductor plating process so as to have the desired wiring pattern.

The etching method is not particularly limited, and may be appropriately selected in accordance with the object, and an ordinary etching method can be used.

The wiring structure is formed by the process stated above.

Repeating the series of processes as necessary of the silica film forming process and the wiring forming process (including the through-via forming process and the conductor plating process) makes it possible to manufacture the multilayer wiring structure which has a high degree of circuit integration.

The method of manufacturing the multilayer wiring structure of the present invention can be suitably used in various fields. Particularly, it is suited for use in the manufacturing of the multilayer wiring structure of the present invention given hereafter.

The multilayer wiring structure of the present invention excels in etching resistance, chemical resistance, moisture resistance, and the adhesive property, and includes the silica film of the present invention, which has a low dielectric constant, on the low dielectric constant film, the parasitic capacity can be reduced and it is possible to increase the signal propagation speed, making it favorable for a semiconductor device, in which higher response speeds are demanded, such as a semiconductor integrated circuit or the like, and especially favorable for a semiconductor device of the present invention as described below.

(Semiconductor Device and Method of Manufacturing the Same)

The semiconductor device of the present invention comprises the silica film of the present invention as either an interlayer insulation film or a protective film formed on the surface of the interlayer insulation film.

The method of manufacturing a semiconductor device of the present invention is the method for manufacturing the semiconductor device of the present invention described above, which includes at least a silica film forming process and a patterning process, as well as any process appropriately selected as necessary.

Hereinafter, the details of the semiconductor device of the present invention will be made clear through the description of the method of manufacturing the semiconductor device of the present invention.

<Silica Film Forming Process>

In the silica film forming process, the silica film is formed on the surface to be processed, using the silica film forming material of the present invention.

Moreover, the details of the surface to be processed, the silica film forming material, and others are as described above.

In the silica film forming process, preferably, the silica film forming material of the present invention is coated onto the surface to be processed, and then heated the surface to be processed, which may be suitably performed according to the method of manufacturing the silica film of the present invention. Moreover, the method for coating is as described in the explanation of the method of manufacturing the silica film of the present invention.

The heating method is not particularly limited, and may be appropriately selected in accordance with the object. Preferably, the organic solvent is dried and the silica film forming material is baked. In this case, the oxidation of a hydrocarbon, aromatic hydrocarbon, and others, which has introduced to the side chain and skeleton of the silicone polymer, can be suppressed.

Conditions such as temperature, atmosphere, and so forth may be appropriately selected in accordance with the object. Preferably, the temperature is 50° C. to 400° C., more preferably, 80° C. to 350° C.

When the temperature is 50° C. or less, sufficient strength may not be obtained because the organic solvent remains in the film, and when the temperature exceeds 400° C., there may be a breakdown of the silicon-hydrocarbon bond of the side chain and skeleton in the silicone polymer.

With regard to the atmosphere, if the heating is performed in the air, there is a fear of raising the dielectric constant due to taking in oxygen from the air. Therefore, the heating may be preferably performed in the presence of an iner gas or under a reduced pressure. Preferable example of the inert gas includes a nitrogen gas.

Furthermore, in the case where the underlying layer of the silica film is a film (for example, a low dielectric constant film such as a porous silica film) formed by, for instance, a spin coating method, the heating process may be performed at one time after coating a material of forming the low dielectric constant film, drying a solvent, and coating the silica film forming material on the low dielectric constant film. In this case, a reduction in the cost to form the film can be devised.

<Patterning Process>

In the patterning process, the surface to be processed is patterned by way of etching by using the silica film obtained by the silica film forming process as an etching mask.

With this patterning process, preferably, after the desired pattern is formed by performing selectively exposing and development the silica film, the etching is performed by using the formed pattern. In this case, the etching can be performed easily to form the desired pattern form.

The pattern can be formed according to known patterning methods.

Moreover, baking treatment can be performed in between the exposing and developing from the perspective of promoting the reaction.

The etching method is not particularly limited, and may be appropriately selected in accordance with the object. For example, a dry etching and wet etching can be given as suitable examples. Since the silica film of the present invention excels in etching resistance, chemical resistance, moisture resistance, and adhesion with the underlying layer, the patterning can be performed with high precision.

<Other Processes>

Other processes are not particularly limited, and may be appropriately selected in accordance with the object, and the wiring structure forming process can be given as an example.

The wiring structure forming process is a process for forming wiring structure, and the details thereof are as given in the explanation of the manufacturing method of the multilayer wiring structure.

Repeating this series of processes as necessary of the silica film forming process, patterning process, and the wiring structure forming process (including the aforementioned through-via forming process and the conductor plating process) can manufacture a semiconductor device having a multilayer wiring structure with a high degree of circuit integration.

An example of the semiconductor device of the present invention is explained hereafter with reference to the drawings.

Figure 1B:
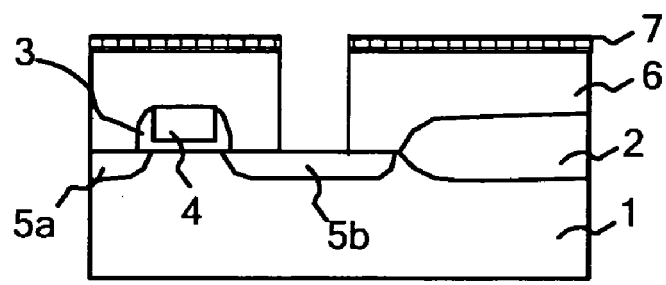
Figure 1C:
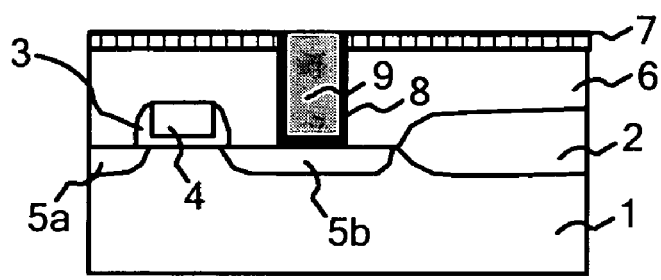

The semiconductor device of the present invention can be obtained, for example, in the following manner. First, as shown in FIG. 1A, a transistor, which has a source diffusion layer 5a, a drain diffusion layer 5b, and a side wall insulation film 3 and is separated by inter-element separation film 2, is formed on a silicon wafer 1. Then, as shown in FIG. 1B, a interlayer insulation film 6 (phosphorus glass) and a stopper film 7 (SiC) is formed on the silicon wafer 1, and then a contact hole for extracting an electrode is formed. As shown in FIG. 1C, after forming the barrier film 8 (TiN) by way of sputtering to have a thickness of 50 nm, a tungsten (W) conductor plug 9 (blanket) is filled in the contact hole by mixing $WF_6$ gas and hydrogen gas and performing a reduction to form a via, and portions other than the via is removed by way of chemical mechanical polishing (CMP).

Figure 1D:
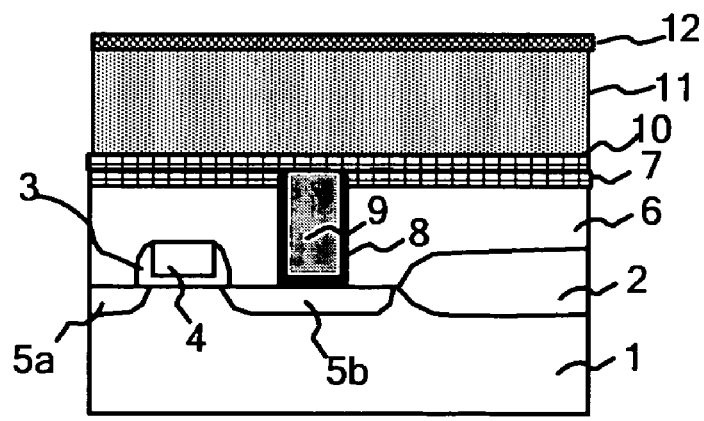
Figure 1E:
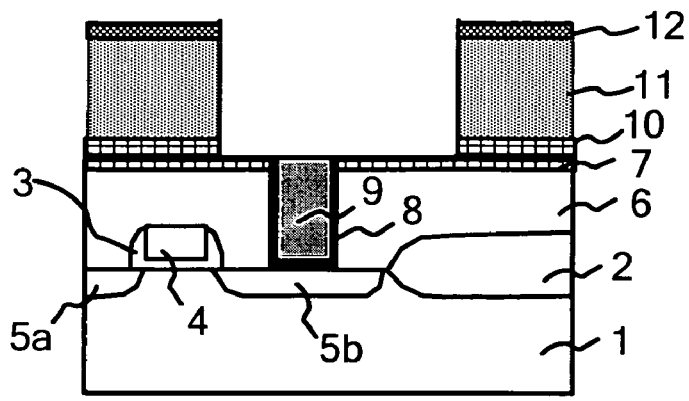
Figure 1F:
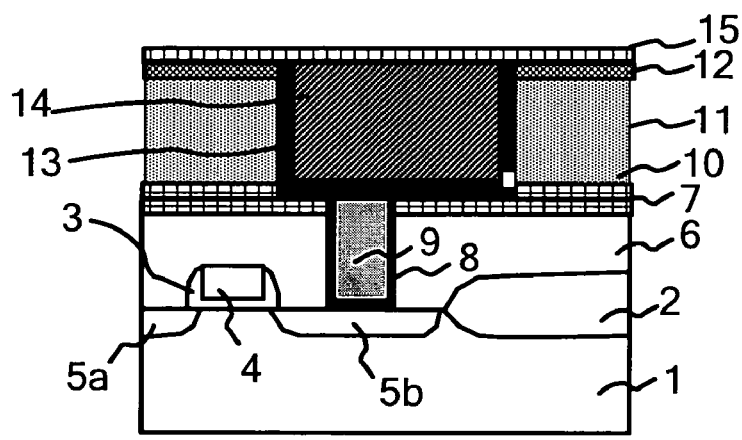

Further, as shown in FIG. 1D, an SiC:O:H film 10 is formed to have a thickness of 30 nm on the stopper film 7 on which the via was formed, and a porous silica film (low dielectric constant film; wiring separation insulating film) 11 is formed thereon so as to have a thickness of 160 nm, and a silica film 12 of the present invention is formed on the porous silica film, using the silica film forming material of the present invention, so as to have a thickness of 30 nm. Further, as shown in FIG. 1E, the silica film 12 is processed by way of the F plasma method with $CF_4/CHF_3$ gas as the source material, using the resist layer as a mask having a pattern of a first wiring layer with a wiring width of 100 nm and a space of 100 nm, thereby forming a wiring trench. Then, as shown in FIG. 1F, a barrier film 13 (TaN) is formed in the wiring trench by way of sputtering method to have a thickness of 10 nm to prevent the diffusion of the wiring material (copper) into the porous silica film 11. Next, a seed layer (Cu), which functions as an electrode at the time of electrolytic plating, is formed on the surface of the burrier film 13 formed in the wiring trench, by way of sputtering method to a thickness of 10 nm. Next, a copper wiring 14 (Cu) is deposited to have a thickness of 600 nm by way of the electrolytic plating, and then the copper is removed except for the wiring pattern portions by way of chemical mechanical polishing (CMP). Then, a stopper film (diffusion prevention film) 15 formed of an SiC:O:H film is formed on the copper wiring 14 (Cu) to have a thickness of 30 nm, thereby forming a first wiring layer (copper). Here, the stopper film (diffusion prevention film) 15 is formed by way of the plasma CVD method by using silane gas and ammonia gas to prevent the diffusion of the wiring material (copper) into the porous silica film 11.

Figure 1G:
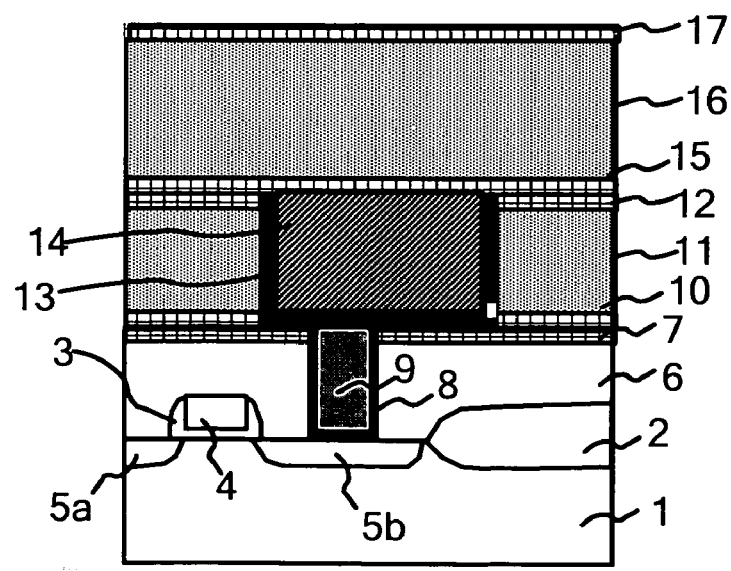
Figure 1H:
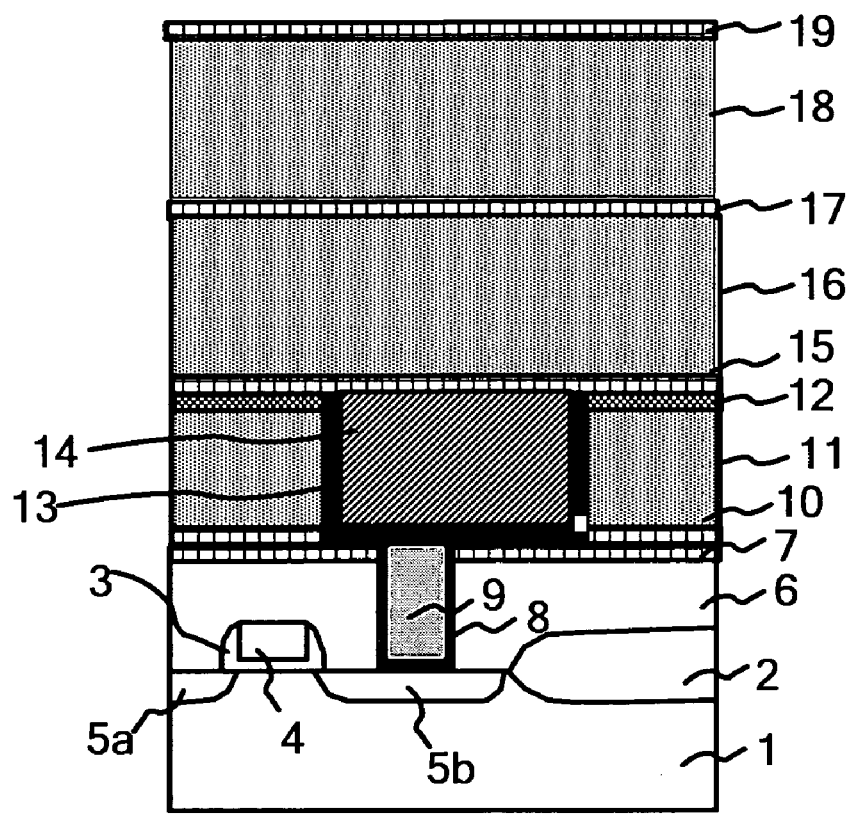

Next, as shown in FIG. 1G, the porous silica film (low dielectric constant film; wiring separation insulating film, SiOC film) 16 is formed on the stopper film (diffusion prevention film) 15 to have a thickness of 180 nm. Then, a silica film 17 of the present invention is formed on the porous silica film 16 to have a thickness of 30 nm by using the silica film forming material of the present invention. Further, as shown in FIG. 1H, a porous silica film (low dielectric constant film) 18 is formed on the silica film 17 to have a thickness of 160 nm, and the silica film 19 of the present invention is formed so as to have a thickness of 30 nm by using the silica film forming material of the present invention.

Figure 1I:
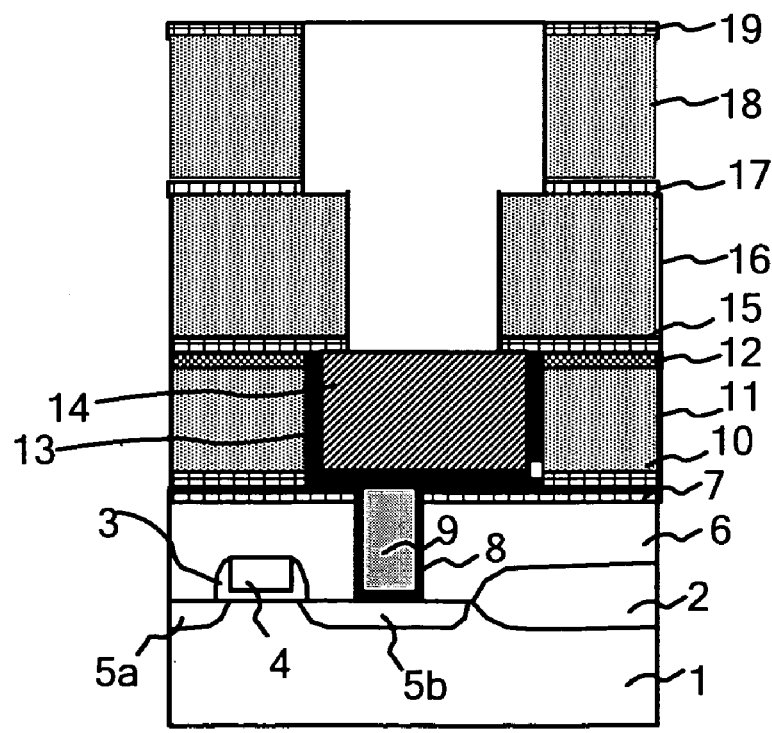
Figure 1J:
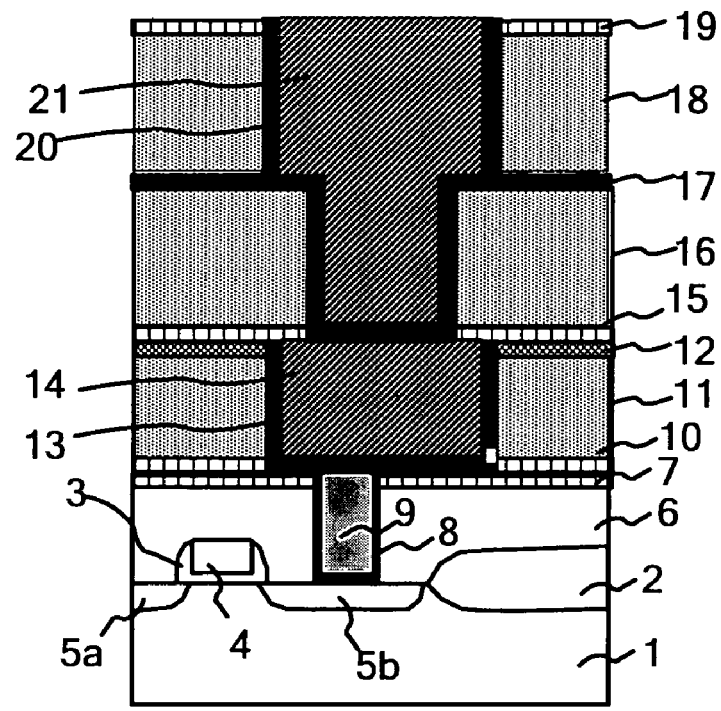
Figure 1K:
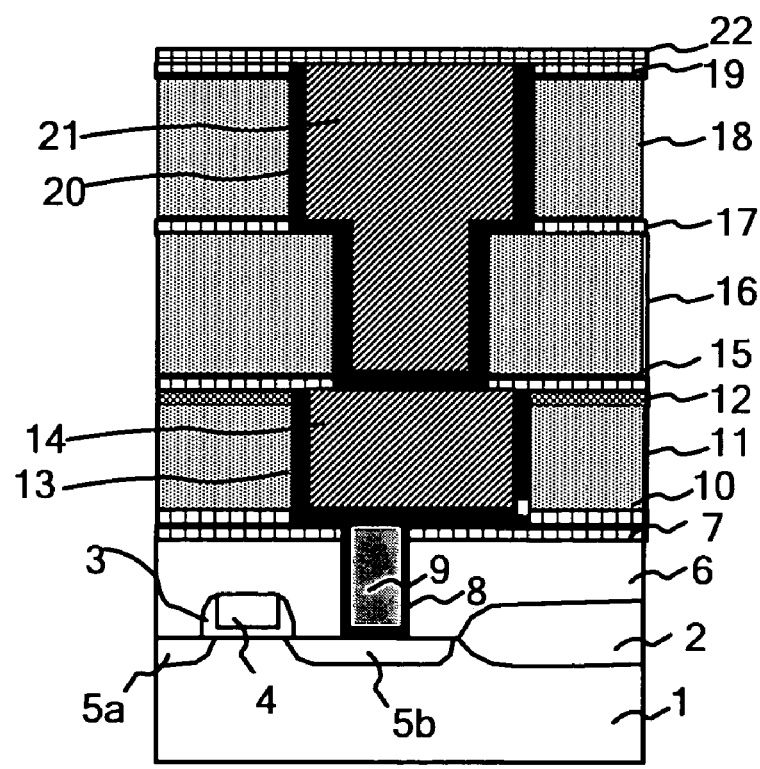

Then, as shown in FIG. 1I, a via is formed in these insulation films by using a resist layer having a via pattern as a mask. Specifically, the silica film 19, the porous silica film 18, the silica film 17, and the porous silica film 16 are processed in this order by way of the F plasma method with $CF_4/CHF_3$ gas as the source material, and changing the gas composition and pressure. Next, a wiring trench is formed by way of the F plasma method using $CF_4/CHF_3$ gas as the source material by using a resist layer having a pattern of a second wiring layer as a mask. Then, as shown in FIG. 1J a barrier film (TaN) 20 for preventing the diffusion of the wiring material (copper) into the porous silica film 18 is formed in the via and the wiring trench by way of sputtering method to have a thickness of 10 nm. Next, a seed layer (Cu), which functions as an electrode at the time of electrolytic plating, is formed to have a thickness of 10 nm on the surface of the barrier film 20 formed in the wiring trench. Next, a copper wiring 21 (Cu) is deposited by way of the electrolytic plating method so as to be a thickness of 1,400 nm, and then the copper is removed except for the wiring pattern portions by way of chemical mechanical polishing (CMP). Further, as shown in FIG. 1K, an SiC:O:H film 22 is formed to have a thickness of 30 nm by way of the plasma CVD method, thereby forming a second via and wiring layer (copper).

A third via and wiring layer (copper) is formed by the same manner as in the second via and wiring layer described above, whereby a semiconductor device having a third layer copper-wiring structure, which corresponds to a multilayer wiring structure of the present invention, can be manufactured.

The method of manufacturing the semiconductor device of the present invention can be suitably used in the manufacture of a semiconductor device having multilayer wiring structure. Further, a high performance semiconductor device can be efficiently manufactured which achieves the reduction of wiring resistance and the reduction of parasitic inter-wiring capacity, and high speed increase of signal propagation speed becomes possible. The method of manufacturing the semiconductor device is especially suitable to the manufacture of the semiconductor device of the present invention which has the silica film of the present invention as an interlayer insulating film, protective film, or the like.

The semiconductor device of the present invention has a silica film of the present invention which is formed by using the silica film forming material of the present invention as a protective film which is formed on the interlayer insulation film or on the surface of the interlayer insulation film. The silica film of the present invention has a low dielectric constant. Therefore, when using the silica film as an interlayer insulating film in a semiconductor device, a semiconductor device having high reliability and a high speed and capable of achieving a reduction in wiring resistance and a reduction in parasitic inter-wiring capacity while being superior in insulation properties between each layer can be obtained. Further, the silica film is superior in etching resistance, chemical resistance, moisture resistance, and adhesion. Therefore, when using the silica film as a protective film, it is possible to protect the interlayer insulation and to form fine wirings.

The semiconductor device of the present invention is especially suitable as, for example, flash memory, DRAM, FRAM, MOS transistor, or the like.

EXAMPLES

Examples of the present invention will be described below, however, the present invention is not limited to the following examples.

Examples 1 to 27

—Preparation of Silica Film Forming Material—

Into a 4-mouth flask, 1,2-bis(dimethylethoxysilyl)ethane (1,2-DMESE) and 1,4-bis(dimethylethoxysilyl)benzene(1,4-DMESB), which are the silicon compounds expressed by the structural formula (3); tetraethoxysilane (TEOS) which is the silicon compound expressed by the structural formula (4); and methyltriethoxysilane (MTEOS) and phenyltriethoxysilane (PTEOS), which are the silicon compounds expressed by the structural formula (5); 500 ppm nitric acid water; and propylene glycolmonomethylether as the organic solvent were poured in the amounts shown in Tables 1 to 3, respectively, and hydrolysis condensation polymerization reaction was performed over a 2 hour period at 50° C., thereby preparing the silica film forming materials.

—Manufacturing Silica Film—

Each silica film forming material thus obtained was coated onto the silicon wafer by way of spin coating at 1,500 rpm of rotation speed for 1 minute so as to have a thickness of 1 μm. Next, each silicon wafer was placed on a hotplate set at a temperature of 150° C. to dry the organic solvent for 3 min under $N_2$ gas atmosphere. Further, each silicon wafer was baked for 30 min under $N_2$ gas atmosphere by using an electric furnace set at the temperature of 400° C., thereby manufacturing the silica films.

Figure 2:
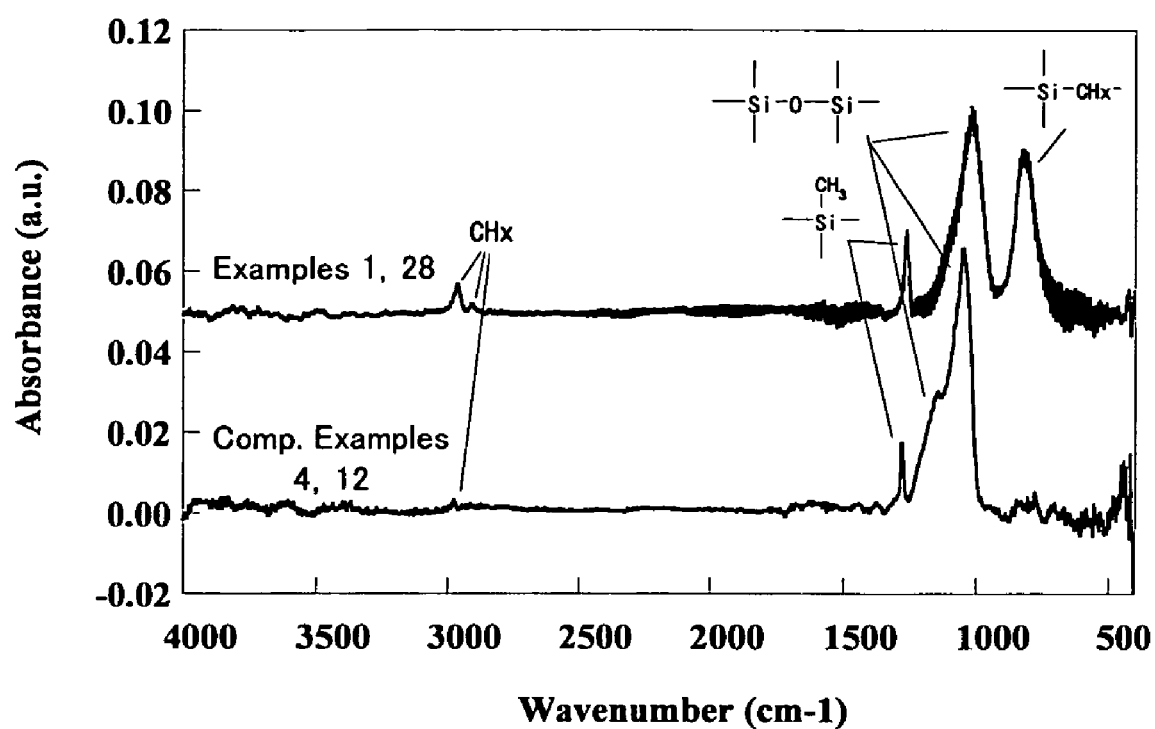
FIG. 2 is a graph showing the results of infrared spectrum analysis of the silica films obtained in the example and the comparative example.

The existence of silicone polymer in the silica film thus obtained was verified by infrared spectroscopic analysis. FIG. 2 shows the composition of the polymer in the silica film of Example 1. According to FIG. 2, the existence of CHx, Si—O—Si bond, Si—$CH_3$ bond, and Si—CHx- bond can be verified in the silica film of Example 1, and it can be found that the silica film of the Example 1 includes the silicone polymer having all of these constructions.

<Measurement of Dielectric Constant>

A gold electrode of 1 mm diameter was formed on each silica film thus obtained, followed by measuring the capacity by using a probe connected to AC power of 1 MHz, 1V. The dielectric constant was calculated based on the measured capacity and the film thickness. The results are shown in Tables 1 through 3.

<Measurement of Adhesion>

A porous silica film (low dielectric constant film, "Celamate NCS" made by Shokubai Kasei) was formed on a silicon substrate. Then, the silica film forming materials of Examples 1 to 27 were coated on the silicon substrate by way of spin coating at 1,500 rpm for 1 min as to be 0.2 μm in thickness, respectively. Next, each silicon substrate was placed on a hot plate set at 150° C. to dry the organic solvent for 3 min under $N_2$ gas atmosphere. Further, each silicon substrate was baked under $N_2$ gas atmosphere for 30 min by using an electric furnace set at a temperature of 400° C., thereby manufacturing the lamination layers each having the silica film and the porous silica film laminated the silica film.

With respect to each lamination layer thus obtained, the adhesion strength to the porous silica film and silica film was measured using an adhesion strength measuring instrument ("Sebastian Five" made by the Quad Group). The results are shown in Tables 1 through 3.

<Measurement of Etching Rate>

Dry etching was performed to each lamination layer by F plasma with $CF_4/CHF_3$ gas as the source material, and the etching rate of the porous silica film and the silica film was measured. The results are shown in Tables 1 through 3.

<Evaluation of Etching Resistance>

Silica films of a thickness of 400 nm were formed by using the silica film forming materials of Examples 1 to 27 after respectively forming a novolak resin films of 150 nm thickness onto a silicon substrate. The wiring pattern with a 200 nm pitch was formed on each silica film by exposing and developing the silica film using an ArF resist. Then, a cross-section of each silica film was observed using a scanning electron microscope (SEM) (made by Hitachi, Ltd.) to verify the resist pattern form. The results are shown in Tables 1 through 3.

Next, a dry etching was performed by F plasma with $CF_4/CHF_3$ gas as the source material to the silica films each having a good resist pattern, and the etching shift amount was respectively measured by way of the SEM. The results are shown in Tables 1 through 3.

Moreover, the etching shift amount indicates the amount of displacement in the actual etching size as compared to the predetermined etching size.

<Evaluation of Chemical Resistance and Moisture Resistance>

The evaluation of the chemical resistance was performed by measuring the etching rate when etching the silica films with a 0.5 mass % HF. Specifically, the silica film forming materials of Examples 1 to 27 were coated onto a silicon substrate by way of spin coating at 1,500 rpm for 1 min so as to be 1 μm in thickness, respectively. Next, each silicon substrate was placed on a hotplate set at 150° C. to dry the organic solvent for 3 min under $N_2$ gas atmosphere. Further, each silicon substrate was baked under $N_2$ gas atmosphere for 30 min by using an electric furnace set at a temperature of 400° C., thereby forming the silica films. Each silicon substrate having the silica film formed thereon was then immersed in 0.5 mass % HF for 1 min and a wet etching was performed, and the etching rate was calculated by measuring the reduced film amount.

The evaluation of the moisture resistance was performed by measuring the change in the dielectric constant between the dielectric constant immediately after the formation of the silica film and that after leaving to stand for 7 days. Specifically, the silica films of 150 nm thickness were formed by using the silica film forming materials of Examples 1 to 27, in the same manner as in the evaluation of the chemical resistance described above. After each silica film was left to stand for 7 days at room temperature, the capacity was measured using a probe connected to an AC power of 1 MHz, 1V. The dielectric constant was calculated based on the measured capacity and the film thickness of the silica film. The results are shown in Tables 1 through 3.

TABLE 1

| | Example No. | | | | | | | | |
|---|---|---|---|---|---|---|---|---|---|
| | 1 | 2 | 3 | 4 | 5 | 6 | 7 | 8 | 9 |
| 1,2-DMESE (mol) | 0.1 | 0.1 | 0.1 | 0.15 | 0.15 | 0.15 | 0.1 | 0.1 | 0.1 |
| 1,4-DMESB (mol) | — | — | — | — | — | — | — | — | — |
| TEOS (mol) | 0.1 | — | — | 0.05 | — | — | 0.05 | 0.05 | — |
| MTEOS (mol) | — | 0.1 | — | — | 0.05 | — | 0.05 | — | 0.05 |
| PTEOS (mol) | — | — | 0.1 | — | — | 0.05 | — | 0.05 | 0.05 |
| 500 ppm nitric acid solution (mol) | 0.7 | 0.6 | 0.6 | 0.6 | 0.5 | 0.5 | 0.6 | 0.6 | 0.5 |
| PGMEA (g) | 200 | 200 | 200 | 200 | 200 | 200 | 200 | 200 | 200 |
| Dielectric constant* | 2.7 | 2.7 | 2.6 | 2.8 | 2.6 | 2.6 | 2.7 | 2.7 | 2.7 |
| Moisture resistance** | 2.7 | 2.7 | 2.6 | 2.8 | 2.6 | 2.6 | 2.7 | 2.7 | 2.7 |
| Chemical resistance (nm/min) | −32 | −16 | −12 | −27 | −10 | −14 | −19 | −15 | −9 |
| Adhesive strength (kgf/mm sq.) | >600 | >600 | >600 | >600 | >600 | >600 | >600 | >600 | >600 |
| Etching rate ratio*** | 1:3 | 1:4 | 1:5 | 1:4 | 1:4 | 1:5 | 1:3 | 1:3 | 1:3 |
| Resist form | Good | Good | Good | Good | Good | Good | Good | Good | Good |
| Etching shift (nm) | 3 | 2 | 3 | 2 | 3 | 3 | 2 | 2 | 3 |

*(dielectric constant immediately after formation of silica film)
**(dielectric constant after leaving to stand for 7 days)
***(ratio of silica film to porous silica film)

TABLE 2

| | Example No. | | | | | | | | |
|---|---|---|---|---|---|---|---|---|---|
| | 10 | 11 | 12 | 13 | 14 | 15 | 16 | 17 | 18 |
| 1,2-DMESE (mol) | — | — | — | — | — | — | — | — | — |
| 1,4-DMESB (mol) | 0.1 | 0.1 | 0.1 | 0.15 | 0.15 | 0.15 | 0.1 | 0.1 | 0.1 |
| TEOS (mol) | 0.1 | — | — | 0.05 | — | — | 0.05 | 0.05 | — |
| MTEOS (mol) | — | 0.1 | — | — | 0.05 | — | 0.05 | — | 0.05 |
| PTEOS (mol) | — | — | 0.1 | — | — | 0.05 | — | 0.05 | 0.05 |
| 500 ppm nitric acid solution (mol) | 0.7 | 0.6 | 0.6 | 0.6 | 0.5 | 0.5 | 0.6 | 0.6 | 0.5 |
| PGMEA (g) | 200 | 200 | 200 | 200 | 200 | 200 | 200 | 200 | 200 |
| Dielectric constant* | 2.8 | 2.7 | 2.7 | 2.6 | 2.7 | 2.7 | 2.6 | 2.7 | 2.7 |
| Moisture resistance** | 2.8 | 2.7 | 2.7 | 2.6 | 2.7 | 2.7 | 2.6 | 2.7 | 2.7 |
| Chemical resistance (nm/min) | −25 | −12 | −12 | −19 | −13 | −18 | −15 | −15 | −13 |
| Adhesive strength (kgf/mm sq.) | >600 | >600 | >600 | >600 | >600 | >600 | >600 | >600 | >600 |
| Etching rate ratio*** | 1:3 | 1:4 | 1:5 | 1:4 | 1:4 | 1:5 | 1:3 | 1:3 | 1:3 |
| Resist form | Good | Good | Good | Good | Good | Good | Good | Good | Good |
| Etching shift (nm) | 3 | 3 | 2 | 3 | 2 | 3 | 3 | 3 | 2 |

*(dielectric constant immediately after formation of silica film)
**(dielectric constant after leaving to stand for 7 days)
***(ratio of silica film to porous silica film)

TABLE 3

| | Example No. | | | | | | | | |
|---|---|---|---|---|---|---|---|---|---|
| | 19 | 20 | 21 | 22 | 23 | 24 | 25 | 26 | 27 |
| 1,2-DMESE (mol) | 0.05 | 0.05 | 0.05 | 0.075 | 0.075 | 0.075 | 0.05 | 0.05 | 0.05 |
| 1,4-DMESB (mol) | 0.05 | 0.05 | 0.05 | 0.075 | 0.075 | 0.075 | 0.05 | 0.05 | 0.05 |
| TEOS (mol) | 0.1 | — | — | 0.05 | — | — | 0.05 | 0.05 | — |
| MTEOS (mol) | — | 0.1 | — | — | 0.05 | — | 0.05 | — | 0.05 |
| PTEOS (mol) | — | — | 0.1 | — | — | 0.05 | — | 0.05 | 0.05 |
| 500 ppm nitric acid solution (mol) | 0.7 | 0.6 | 0.6 | 0.5 | 0.5 | 0.5 | 0.7 | 0.7 | 0.6 |
| PGMEA (g) | 200 | 200 | 200 | 200 | 200 | 200 | 200 | 200 | 200 |
| Dielectric constant* | 2.7 | 2.6 | 2.6 | 2.7 | 2.6 | 2.6 | 2.6 | 2.6 | 2.6 |
| Moisture resistance** | 2.7 | 2.6 | 2.6 | 2.7 | 2.6 | 2.6 | 2.6 | 2.6 | 2.6 |
| Chemical resistance (nm/min) | −27 | −14 | −18 | −24 | −18 | −29 | −21 | −25 | −18 |
| Adhesive strength (kgf/mm sq.) | >600 | >600 | >600 | >600 | >600 | >600 | >600 | >600 | >600 |
| Etching rate ratio*** | 1:4 | 1:4 | 1:5 | 1:4 | 1:4 | 1:5 | 1:4 | 1:4 | 1:4 |
| Resist form | Good | Good | Good | Good | Good | Good | Good | Good | Good |
| Etching shift (nm) | 3 | 3 | 2 | 3 | 3 | 3 | 2 | 3 | 3 |

*(dielectric constant immediately after formation of silica film)
**(dielectric constant after leaving to stand for 7 days)
***(ratio of silica film to porous silica film)

From the results of tables 1 to 3, it has been found that each silica film made by the silica film forming materials of Examples 1 to 27 has low dielectric constant, does not change the dielectric constant even after seven days, has excellent moisture resistance, chemical resistance and etching resistance (etching rate ratio) with a small amount of etching shift, possesses resistance to both wet and dry etching, and has good adhesive strength.

Comparative Examples 1 to 8

The silica films of Comparative Examples were manufactured by preparing the silica film forming materials in the same manner as in Example 1, except for using one of the following (a) and (b), in the amounts as shown in Table 4,
(a) 1,2-bis (dimethylethoxysilyl)ethane (1,2-DMESE) and 1,4-bis (dimethylethoxysilyl) benzene (1,4-DMESB), which are the silicon compounds expressed by the structural formula (3), and
(b) at least one of tetraethoxysilane (TEOS) which is the silicon compound expressed by the structural formula (4); and methyltriethoxysilane (MTEOS) and phenyltriethoxysilane (PTEOS), which are the silicon compounds expressed by the structural formula (5), and except that the hydrolysis condensation polymerization reaction was not performed. Moreover, the characteristics of the respective silica films were evaluated in the same manner as in Example 1. The results are also shown in Table 4.

In addition, the existence of silicone polymer in the silica film thus obtained was verified by infrared spectroscopic analysis. FIG. 2 shows the composition of the polymer in the silica film of Comparative Example 4. According to FIG. 2, the existence of CHx, Si—O—Si bond, Si—CH₃ bond, and Si—CHx- bond cannot be verified in the silica film of Comparative Example 4, and it can be found that the silica film of the Comparative Example 4 does not include the silicone polymer having all of these constructions.

TABLE 4

| | Comp. Example No. | | | | | | | |
|---|---|---|---|---|---|---|---|---|
| | 1 | 2 | 3 | 4 | 5 | 6 | 7 | 8 |
| 1,2-DMESE (mol) | — | — | — | — | — | — | 0.2 | — |
| 1,4-DMESB (mol) | — | — | — | — | — | — | — | 0.2 |
| TEOS (mol) | 0.2 | — | — | 0.1 | 0.1 | — | — | — |
| MTEOS (mol) | — | 0.2 | — | 0.1 | — | 0.1 | — | — |
| PTEOS (mol) | — | — | 0.2 | — | 0.1 | 0.1 | — | — |
| 500 ppm nitric acid solution (mol) | 0.8 | 0.6 | 0.6 | 0.7 | 0.7 | 0.6 | 0.7 | 0.7 |
| PGMEA (g) | 200 | 200 | 200 | 200 | 200 | 200 | 200 | 200 |

TABLE 4-continued

| | Comp. Example No. | | | | | | | |
|---|---|---|---|---|---|---|---|---|
| | 1 | 2 | 3 | 4 | 5 | 6 | 7 | 8 |
| Dielectric constant* | 4.8 | 3.2 | 3.2 | 4.1 | 3.9 | 3.3 | 2.7 | 2.8 |
| Moisture resistance** | 5.6 | 3.8 | 3.3 | 4.3 | 4.2 | 3.4 | 2.7 | 2.9 |
| Chemical resistance (nm/min) | −721 | −436 | −332 | −530 | −480 | −392 | −211 | −134 |
| Adhesive strength (kgf/mm sq.) | >600 | >600 | 520 | 480 | 440 | 330 | 260 | 190 |
| Etching rate ratio*** | 1:1 | 1:1 | 1:2 | 1:1 | 1:1 | 1:2 | 1:15 | 1:15 |
| Resist form | Pattern collapse | Pattern collapse | Good | Pattern collapse | Good | Good | Good | Good |
| Etching shift (nm) | 21 | 15 | 6 | 14 | 12 | 8 | Unopened | Unopened |

*(dielectric constant immediately after formation of silica film)
**(dielectric constant after leaving to stand for 7 days)
***(ratio of silica film to porous silica film)

From the results of table 4, it has been found that each silica film made by the silica film forming materials of Comparative Examples 1 to 8 has high dielectric constant, increases further the dielectric constant after seven days, has poor moisture resistance, chemical resistance and etching resistance (etching rate ratio) with a large amount of etching shift, possesses low resistance to both wet and dry etching, and has low adhesive strength.

Examples 28 to 54

—Preparation of Silica Film Forming Material—

Into a 4-mouth flask, 1,2-bis (dimethylchlorosilyl) ethane (1,2-DMCSE) and 1,4-bis(dimethylchlorosilyl)benzene(1,4DMCSB), which are the silicon compounds expressed by the structural formula (10); tetrachlorosilane (TCS) which is the silicon compound expressed by the structural formula (11); methyltrichlorosilane (MTCS) and phenyltrichlorosilane (PTCS), which are the silicon compounds expressed by the structural formula (12); 500 ppm nitric acid water; and propylene glycolmonomethylether as the organic solvent were poured in the amounts shown in Tables 5 to 7, respectively, and hydrolysis condensation polymerization reaction was performed over a 2 hour period at 50 ° C., thereby preparing the silica film forming materials.

The silica films of Examples 28 to 54 were manufactured by using the silica film forming materials thus obtained in the same manner as in Example 1. Further, the characteristics of the respective silica films were evaluated in the same manner as in Example 1, the respective results of which are shown in Tables 5 to 7 as well.

In addition, the existence of silicone polymer in the silica film thus obtained was verified by infrared spectroscopic analysis. FIG. 2 shows the composition of the polymer in the silica film of Example 28. According to FIG. 2, the existence of CHx, Si—O—Si bond, Si—$CH_3$ bond, and Si—CHx-bond can be verified in the silica film of Example 28, and it can be found that the silica film of the Example 28 includes the silicone polymer having all of these constructions.

TABLE 5

| | Example No. | | | | | | | | |
|---|---|---|---|---|---|---|---|---|---|
| | 28 | 29 | 30 | 31 | 32 | 33 | 34 | 35 | 36 |
| 1,2-DMCSE (mol) | 0.1 | 0.1 | 0.1 | 0.15 | 0.15 | 0.15 | 0.1 | 0.1 | 0.1 |
| 1,4-DMCSB (mol) | — | — | — | — | — | — | — | — | — |
| TCS (mol) | 0.1 | — | — | 0.05 | — | — | 0.05 | 0.05 | — |
| MTCS (mol) | — | 0.1 | — | — | 0.05 | — | 0.05 | — | 0.05 |
| PTCS (mol) | — | — | 0.1 | — | — | 0.05 | — | 0.05 | 0.05 |
| 500 ppm nitric acid solution (mol) | 0.7 | 0.6 | 0.6 | 0.6 | 0.5 | 0.5 | 0.6 | 0.6 | 0.5 |
| PGMEA (g) | 200 | 200 | 200 | 200 | 200 | 200 | 200 | 200 | 200 |
| Dielectric constant* | 2.7 | 2.7 | 2.6 | 2.7 | 2.6 | 2.6 | 2.8 | 2.7 | 2.7 |
| Moisture resistance** | 2.7 | 2.7 | 2.6 | 2.7 | 2.6 | 2.6 | 2.8 | 2.7 | 2.7 |
| Chemical resistance (nm/min) | −32 | −16 | −12 | −27 | −10 | −14 | −19 | −15 | −9 |

TABLE 5-continued

|  | Example No. | | | | | | | | |
| --- | --- | --- | --- | --- | --- | --- | --- | --- | --- |
|  | 28 | 29 | 30 | 31 | 32 | 33 | 34 | 35 | 36 |
| Adhesive strength (kgf/mm sq.) | >600 | >600 | >600 | >600 | >600 | >600 | >600 | >600 | >600 |
| Etching rate ratio*** | 1:3 | 1:4 | 1:5 | 1:4 | 1:4 | 1:5 | 1:3 | 1:3 | 1:3 |
| Resist form | Good | Good | Good | Good | Good | Good | Good | Good | Good |
| Etching shift (nm) | 2 | 2 | 3 | 2 | 2 | 3 | 2 | 2 | 3 |

*(dielectric constant immediately after formation of silica film)
**(dielectric constant after leaving to stand for 7 days)
***(ratio of silica film to porous silica film)

TABLE 6

|  | Example No. | | | | | | | | |
| --- | --- | --- | --- | --- | --- | --- | --- | --- | --- |
|  | 37 | 38 | 39 | 40 | 41 | 42 | 43 | 44 | 45 |
| 1,2-DMCSE (mol) | — | — | — | — | — | — | — | — | — |
| 1,4-DMCSB (mol) | 0.1 | 0.1 | 0.1 | 0.15 | 0.15 | 0.15 | 0.1 | 0.1 | 0.1 |
| TCS (mol) | 0.1 | — | — | 0.05 | — | — | 0.05 | 0.05 | — |
| MTCS (mol) | — | 0.1 | — | — | 0.05 | — | 0.05 | — | 0.05 |
| PTCS (mol) | — | — | 0.1 | — | — | 0.05 | — | 0.05 | 0.05 |
| 500 ppm nitric acid solution (mol) | 0.7 | 0.6 | 0.6 | 0.6 | 0.5 | 0.5 | 0.6 | 0.6 | 0.5 |
| PGMEA (g) | 200 | 200 | 200 | 200 | 200 | 200 | 200 | 200 | 200 |
| Dielectric constant* | 2.8 | 2.7 | 2.7 | 2.6 | 2.7 | 2.7 | 2.6 | 2.7 | 2.7 |
| Moisture resistance** | 2.8 | 2.7 | 2.7 | 2.6 | 2.7 | 2.7 | 2.6 | 2.7 | 2.7 |
| Chemical resistance (nm/min) | −25 | −12 | −12 | −19 | −13 | −18 | −15 | −15 | −13 |
| Adhesive strength (kgf/mm sq.) | >600 | >600 | >600 | >600 | >600 | >600 | >600 | >600 | >600 |
| Etching rate ratio*** | 1:3 | 1:4 | 1:5 | 1:4 | 1:4 | 1:5 | 1:3 | 1:3 | 1:3 |
| Resist form | Good | Good | Good | Good | Good | Good | Good | Good | Good |
| Etching shift (nm) | 2 | 3 | 2 | 2 | 2 | 3 | 3 | 3 | 2 |

*(dielectric constant immediately after formation of silica film)
**(dielectric constant after leaving to stand for 7 days)
***(ratio of silica film to porous silica film)

TABLE 7

|  | Example No. | | | | | | | | |
| --- | --- | --- | --- | --- | --- | --- | --- | --- | --- |
|  | 46 | 47 | 48 | 49 | 50 | 51 | 52 | 53 | 54 |
| 1,2-DMCSE (mol) | 0.05 | 0.05 | 0.05 | 0.075 | 0.075 | 0.075 | 0.05 | 0.05 | 0.05 |
| 1,4-DMCSB (mol) | 0.05 | 0.05 | 0.05 | 0.075 | 0.075 | 0.075 | 0.05 | 0.05 | 0.05 |
| TCS (mol) | 0.1 | — | — | 0.05 | — | — | 0.05 | 0.05 | — |
| MTCS (mol) | — | 0.1 | — | — | 0.05 | — | 0.05 | — | 0.05 |
| PTCS (mol) | — | — | 0.1 | — | — | 0.05 | — | 0.05 | 0.05 |
| 500 ppm nitric acid solution (mol) | 0.7 | 0.6 | 0.6 | 0.5 | 0.5 | 0.5 | 0.7 | 0.7 | 0.6 |
| PGMEA (g) | 200 | 200 | 200 | 200 | 200 | 200 | 200 | 200 | 200 |
| Dielectric constant* | 2.7 | 2.6 | 2.6 | 2.6 | 2.6 | 2.6 | 2.6 | 2.6 | 2.6 |
| Moisture resistance** | 2.7 | 2.6 | 2.6 | 2.6 | 2.6 | 2.6 | 2.6 | 2.6 | 2.6 |

TABLE 7-continued

| | Example No. | | | | | | | | |
|---|---|---|---|---|---|---|---|---|---|
| | 46 | 47 | 48 | 49 | 50 | 51 | 52 | 53 | 54 |
| Chemical resistance (nm/min) | −27 | −14 | −18 | −24 | −18 | −29 | −21 | −25 | −18 |
| Adhesive strength (kgf/mm sq.) | >600 | >600 | >600 | >600 | >600 | >600 | >600 | >600 | >600 |
| Etching rate ratio*** | 1:4 | 1:4 | 1:5 | 1:4 | 1:4 | 1:5 | 1:4 | 1:4 | 1:4 |
| Resist form | Good | Good | Good | Good | Good | Good | Good | Good | Good |
| Etching shift (nm) | 3 | 2 | 2 | 2 | 2 | 2 | 2 | 2 | 3 |

*(dielectric constant immediately after formation of silica film)
**(dielectric constant after leaving to stand for 7 days)
***(ratio of silica film to porous silica film)

From the results of tables 5 to 7, it has been found that, as the same with the Examples 1 to 27, each silica film made by the silica film forming materials of Examples 28 to 54 has low dielectric constant, does not change the dielectric constant even after seven days, has excellent moisture resistance, chemical resistance and etching resistance (etching rate ratio) with a small amount of etching shift, possesses resistance to both wet and dry etching, and has good adhesive strength.

Comparative Examples 9 to 16

The silica films of Comparative Examples 9 to 16 were manufactured by preparing the silica film forming materials in the same manner as in Example 28, except for using one of the following (a) and (b), in the amounts as shown in Table 8, (a) 1,2-bis (dimethylchlorosilyl) ethane (1,2-DMCSE) and 1,4-bis (dimethylchlorosilyl) benzene (1,4-DMCSB), which are the silicon compounds expressed by the structural formula (10), and (b) at least one of tetrachlorosillan (TCS) which is the silicon compound expressed by the structural formula (11); and methyltrichlorosillan (MTCS) and phenyltrichlorosillan (PTCS), which are the silicon compounds expressed by the structural formula (12), and except that the hydrolysis condensation polymerization reaction was not performed. Moreover, the characteristics of the respective silica films were evaluated in the same manner as in Example 1. The results are also shown in Table 8.

In addition, the existence of silicone polymer in the silica film thus obtained was verified by infrared spectroscopic analysis. FIG. 2 shows the composition of the polymer in the silica film of Comparative Example 12. According to FIG. 2, the existence of CHx, Si—O—Si bond, Si—$CH_3$ bond, and Si—CHx- bond cannot be verified in the silica film of Comparative Example 12, and it can be found that the silica film of the Comparative Example 12 does not include the silicone polymer having all of these constructions.

TABLE 8

| | Comp. Example No. | | | | | | | |
|---|---|---|---|---|---|---|---|---|
| | 9 | 10 | 11 | 12 | 13 | 14 | 15 | 16 |
| 1,2-DMCSE (mol) | — | — | — | — | — | — | 0.2 | — |
| 1,4-DMCSB (mol) | — | — | — | — | — | — | — | 0.2 |
| TCS (mol) | 0.2 | — | — | 0.1 | 0.1 | — | — | — |
| MTCS (mol) | — | 0.2 | — | 0.1 | — | 0.1 | — | — |
| PTCS (mol) | — | — | 0.2 | — | 0.1 | 0.1 | — | — |
| 500 ppm nitric acid solution (mol) | 0.8 | 0.6 | 0.6 | 0.7 | 0.7 | 0.6 | 0.7 | 0.7 |
| PGMEA (g) | 200 | 200 | 200 | 200 | 200 | 200 | 200 | 200 |
| Dielectric constant* | 4.8 | 3.3 | 3.2 | 4.1 | 3.4 | 3.4 | 2.7 | 2.8 |
| Moisture resistance** | 5.6 | 3.5 | 3.4 | 4.6 | 3.8 | 3.5 | 3.0 | 3.0 |
| Chemical resistance (nm/min) | −721 | −436 | −332 | −530 | −480 | −392 | −211 | −134 |
| Adhesive strength (kgf/mm sq.) | >600 | >600 | 520 | 480 | 440 | 330 | 260 | 190 |
| Etching rate ratio*** | 1:1 | 1:1 | 1:2 | 1:1 | 1:1 | 1:2 | 1:15 | 1:15 |

TABLE 8-continued

| | Comp. Example No. | | | | | | | |
|---|---|---|---|---|---|---|---|---|
| | 9 | 10 | 11 | 12 | 13 | 14 | 15 | 16 |
| Resist form | Pattern collapse | Pattern collapse | Good | Pattern collapse | Good | Good | Good | Good |
| Etching shift (nm) | 18 | 16 | 8 | 12 | 10 | 6 | Unopened | Unopened |

*(dielectric constant immediately after formation of silica film)
**(dielectric constant after leaving to stand for 7 days)
***(ratio of silica film to porous silica film)

From the results of table 8, it has been found that, as the same with Comparative Examples 1 to 8, each silica film made by the silica film forming materials of Comparative Examples 9 to 16 has high dielectric constant, increases further the dielectric constant after seven days, has poor moisture resistance, chemical resistance and etching resistance (etching rate ratio) with a large amount of etching shift, possesses low resistance to both wet and dry etching, and has low adhesive strength.

Example 55

—Manufacture of Multilayer Wiring Structure and Semiconductor Device—

The multilayer wiring structure and the semiconductor device of the present invention were manufactured as follows. First, as shown in FIG. 1A, a transistor, which has a source diffusion layer 5a, a drain diffusion layer 5b, and a side wall insulation film 3 and is separated by inter-element separation film 2, was formed on a silicon wafer 1. Then, as shown in FIG. 1B, a interlayer insulation film 6 (phosphorus glass) and a stopper film 7 (SiC) was formed on the silicon wafer 1, and then a contact hole for extracting an electrode was formed. As shown in FIG. 1C, after forming the barrier film 8 (TiN) by way of sputtering to have a thickness of 50 nm, a tungsten (W) conductor plug 9 (blanket) was filled in the contact hole by mixing $WF_6$ gas and hydrogen gas and performing a reduction to form a via, and portions other than the via was removed by way of chemical mechanical polishing (CMP).

Further, as shown in FIG. 1D, an SiC:O:H film 10 was formed to have a thickness of 30 nm on the stopper film 7 on which the via has been formed, and a porous silica film (low dielectric constant film; wiring separation insulating film) 11 was formed thereon so as to have a thickness of 160 nm, and a silica film 12 was formed on the porous silica film, using the silica film forming material of Example 1, so as to have a thickness of 30 nm. Further, as shown in FIG. 1E, the silica film 12 was processed by way of the F plasma method with $CF_4/CHF_3$ gas as the source material, using the resist layer as a mask having a pattern of a first wiring layer with a wiring width of 100 nm and a space of 100 nm, thereby forming a wiring trench. Then, as shown in FIG. 1F, a barrier film 13 (TaN) was formed in the wiring trench by way of sputtering method to have a thickness of 10 nm to prevent the diffusion of the wiring material (copper) into the porous silica film 11. Next, a seed layer (Cu), which functions as an electrode at the time of electrolytic plating, was formed on the surface of the barrier film 13 formed in the wiring trench, by way of sputtering method to a thickness of 10 nm. Next, a copper wiring 14 (Cu) was deposited to have a thickness of 600 nm by way of the electrolytic plating, and then the copper was removed except for the wiring pattern portions by way of chemical mechanical polishing (CMP). Then, a stopper film (diffusion prevention film) 15 formed of an SiC:O:H film was formed on the copper wiring 14 (Cu) to have a thickness of 30 nm, thereby forming a first wiring layer (copper). Here, the stopper film (diffusion prevention film) 15 was formed by way of the plasma CVD method by using silane gas and ammonia gas to prevent the diffusion of the wiring material (copper) into the porous silica film 11.

Next, as shown in FIG. 1G, the porous silica film (low dielectric constant film; wiring separation insulating film, SiOC film) 16 was formed on the stopper film (diffusion prevention film) 15 to have a thickness of 180 nm. Then, a silica film 17 was formed on the porous silica film 16 to have a thickness of 30 nm by using the silica film forming material of Example 1. Further, as shown in FIG. 1H, a porous silica film (low dielectric constant film) 18 was formed on the silica film 17 to have a thickness of 160 nm, and the silica film 19 was formed so as to have a thickness of 30 nm by using the silica film forming material of Example 1.

Then, as shown in FIG. 1I, a via was formed in these insulation films by using a resist layer having a via pattern as a mask. Specifically, the silica film 19, the porous silica film 18, the silica film 17, and the porous silica film 16 were processed in this order by way of the F plasma method with $CF_4/CHF_3$ gas as the source material, and changing the gas composition and pressure. Next, a wiring trench was formed by way of the F plasma method using $CF_4/CHF_3$ gas as the source material by using a resist layer having a pattern of a second wiring layer as a mask. Then, as shown in FIG. 1J, a barrier film (TaN) 20 for preventing the diffuaion of the wiring material (copper) into the porous silica film 18 was formed in the via and the wiring trench by way of sputtering method to have a thickness of 10 nm. Next, a seed layer (Cu), which functions as an electrode at the time of electrolytic plating, was formed to have a thickness of 10 nm on the surface of the barrier film 20 formed in the wiring trench. Next, a copper wiring 21 (Cu) was deposited by way of the electrolytic plating method so as to be a thickness of 1,400 nm, and then the copper was removed except for the wiring pattern portions by way of chemical mechanical polishing (CMP). Further, as shown in FIG. 1K, an SiC:O:H film 22 was formed to have a thickness of 30 nm by way of the plasma CVD method, thereby forming a second via and wiring layer (copper).

A third via and wiring layer (copper) was formed by the same manner as in the second via and wiring layer described above, whereby a semiconductor device having a third layer copper-wiring structure, which corresponds to a multilayer wiring structure of the present invention, was manufactured.

In the manner described above, one million semiconductor devices having continuous via in which the via and copper wiring are provided in series were manufactured. The yield of the continuous via was 91%. Moreover, an effective dielectric constant was computed based on the inter-layer capacity to be 2.6. Moreover, wiring resistance was measured with a resistance measuring instrument ("HP4284A made by Agilent Technology of US) after leaving to stand for 3,000 hours at the high temperature of 200° C., which indicated no increase in resistance.

Example 56

Multilayer wiring structure and semiconductor device of Example 56 were manufactured by forming the silica films 12, 17 and 19 in the same manner as in Example 55, except that the silica film forming material of Example 1 was replaced by that of Example 28.

One million semiconductor devices of Example 56 having continuous via in which the via and copper wiring are provided in series were manufactured. The yield of the continuous via was 96%. Moreover, an effective dielectric constant was computed based on the inter-layer capacity to be 2.55. Moreover, wiring resistance was measured with a resistance measuring instrument ("HP4284A made by Agilent Technology of US) after leaving to stand for 3,000 hours at a high temperature of 200° C., which indicated no increase in resistance.

Comparative Example 17

Multilayer wiring structure and semiconductor device of Comparative Example 17 were manufactured by forming the silica films 12, 17 and 19 in the same manner as in Example 55, except that the silica film forming material of Example 1 was replaced by that of Comparative Example 1.

One million semiconductor devices of Comparative Example 17 having continuous via in which the via and copper wiring are provided in series were manufactured. The yield of the continuous via was 34%. Moreover, an effective dielectric constant was computed based on the inter-layer capacity to be as high as 2.55, which is quite high. Moreover, wiring resistance was measured with a resistance measuring instrument ("HP4284A made by Agilent Technology of US) after leaving to stand for 3,000 hours at a high temperature of 200° C., which indicated increase in resistance.

The present invention can overcome the problems in the related art and provide a silica film with excellent etching resistance, chemical resistance, adhesiveness, and a low dielectric constant along with the effective manufacturing method thereof, silica film forming material suitable for formation of the silica film, multilayer wiring structure enabling reduction of inter-layer parasitic capacity along with the effective manufacturing method thereof, and a high-speed, highly reliable semiconductor device having the silica film as an interlayer insulation film and the like along with the effective manufacturing method thereof.

The silica film forming material of the present invention has excellent etching resistance, chemical resistance, moisture resistance and adhesiveness as well as a low dielectric constant. Hence, it is extremely suitable for use in an interlayer insulation film and/or a protection film to be formed on the surface of the interlayer insulation film. Moreover, the silica film forming material of the present invention is particularly suitable for manufacturing the silica film of the present invention, the multilayer wiring structure of the present invention and the semiconductor device of the present invention.

The method of manufacturing a silica film of the present invention is extremely suitable for manufacturing various low dielectric constant films such as an interlayer insulation film and protection film. Moreover, the method of manufacturing a silica film of the present invention is particularly suitable for manufacturing the silica film of the present invention.

The silica film of the present invention excels in properties of etching resistance, chemical resistance, moisture resistance, and adhesiveness with an underlying layer, making it particularly suitable for use in a semiconductor integration circuit and the like in which a higher response speed is required.

The method of manufacturing a multilayer wiring structure of the present invention is extremely suitable for manufacturing the multilayer wiring structure of the present invention.

The multilayer wiring structure of the present invention increases signal transmission speed, and hence is particularly suitable for a semiconductor integration circuit and the like in which a higher response speed is required.

The method of manufacturing a semiconductor device of the present invention is suitably used for manufacturing various semiconductor devices, such as flash memories, DRAM, FRAM, and MOS transistors, and particularly suitable for manufacting the semiconductor device of the present invention.

The semiconductor device of the present invention enables lowering inter-wiring parasitic capacity and wiring resistance, and has high speed and reliability.

What is claimed is:

1. A silica film forming material, comprising a silicone polymer which comprises, as part of its structure, an Si—O—Si bond, an Si-CH$_3$ bond and an Si—CHx- bond, where x represents an integer of 0 to 2, wherein the silicone polymer is obtained by a hydrolysis condensation polymerization reaction of at least one silicon compound expressed by the following general formulae (1) to (3), and at least one of silicon compound expressed by the following general formulae (4) to (7):

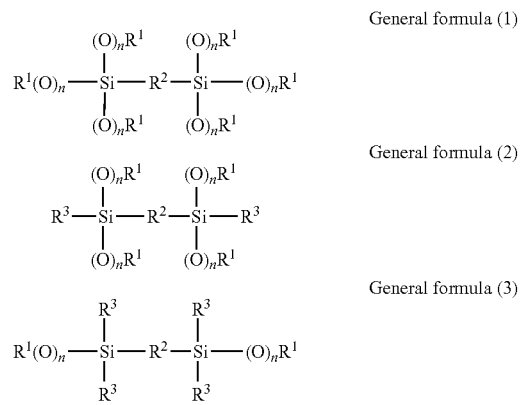

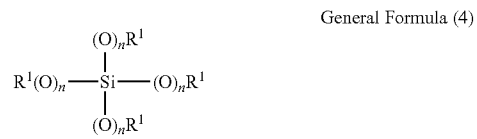

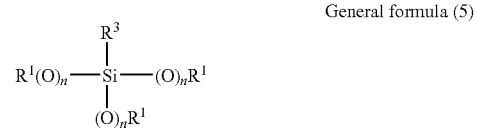

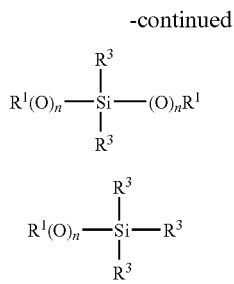

where, in the general formulas (1) to (7), n represents either 0 or 1; $R^1$ may be the same as or different from each other, represents one selected from the group consisting of a chlorine atom, a bromine atom, a fluorine atom, and a hydrogen atom when n=0, and represents one selected from the group consisting of a hydrocarbon with a carbon number of 1 to 4, an aromatic hydrocarbon, a hydrogen atom and a carboxyl group when n=1; $R^2$ represents one selected from the group consisting of a hydrocarbon with a carbon number of 1 to 4, and an aromatic hydrocarbon; and $R^3$ may be the same as or different from each other, and represents one selected from the group consisting of a hydrocarbon with a carbon number of 1 to 3 and an aromatic hydrocarbon.

2. The silica film forming material according to claim 1, wherein the hydrolysis condensation polymerization reaction is performed with a solution having a pH of 1 to 11.

\* \* \* \* \*

UNITED STATES PATENT AND TRADEMARK OFFICE
CERTIFICATE OF CORRECTION

PATENT NO. : 7,659,357 B2 Page 1 of 1
APPLICATION NO. : 11/274094
DATED : February 9, 2010
INVENTOR(S) : Nakata et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 732 days.

Signed and Sealed this

Twenty-eighth Day of December, 2010

David J. Kappos
*Director of the United States Patent and Trademark Office*